United States Patent [19]

Suzuki et al.

[11] Patent Number: 5,651,414
[45] Date of Patent: Jul. 29, 1997

[54] HEAT-PIPE TYPE COOLING APPARATUS

[75] Inventors: Osamu Suzuki, Ibaraki-ken; Heikichi Kuwahara, Tsuchiura; Kazumasa Fujioka, Ibaraki-ken; Syuuji Saitoo, Katsuta; Nobuo Suzuki, Tsuchiura; Koichi Isaka, Ishioka, all of Japan

[73] Assignees: Hitachi, Ltd.; Hitachi Cable, Ltd., both of Japan

[21] Appl. No.: 364,928

[22] Filed: Dec. 28, 1994

[30] Foreign Application Priority Data

Dec. 28, 1993 [JP] Japan ................. 5-334936

[51] Int. Cl.$^6$ ........................... F28D 15/00
[52] U.S. Cl. .................. 165/104.14; 165/104.33
[58] Field of Search ............ 165/104.26, 104.33, 165/104.14

[56] References Cited

U.S. PATENT DOCUMENTS

| 3,174,540 | 3/1965 | Dutton ................. 165/104.33 X |
| 3,302,042 | 1/1967 | Grover et al. ............ 165/104.26 X |
| 4,131,158 | 12/1978 | Abhat et al. ............ 165/104.26 X |
| 4,147,206 | 4/1979 | Basiulis .................. 165/104.26 X |
| 4,982,274 | 1/1991 | Murase et al. .............. 165/104.33 |
| 5,229,915 | 7/1993 | Ishibashi et al. ........ 165/104.33 X |

FOREIGN PATENT DOCUMENTS

| 0441572A2 | 8/1991 | European Pat. Off. . |
| 24 17 106 | 10/1975 | Germany . |
| 0007858 | 1/1978 | Japan ................. 165/104.33 |
| 0100292 | 8/1981 | Japan ................. 165/104.33 |
| 0138692 | 10/1981 | Japan ................. 165/104.33 |
| 0207039 | 9/1986 | Japan ................. 165/104.33 |
| 2-229455 | 9/1990 | Japan . |
| 2167550 | 5/1986 | United Kingdom ........ 165/104.33 |

OTHER PUBLICATIONS

European Srch. Report Mar. 28, 1895, Europe.

*Primary Examiner*—John Rivell
*Assistant Examiner*—Christopher Atkinson
*Attorney, Agent, or Firm*—Evenson, McKeown, Edwards & Lenahan, P.L.L.C.

[57] ABSTRACT

A cooling apparatus having a plurality of heat pipes is improved to reduce the condensation capacity of selected heat pipes when ambient air temperature is low, so as to facilitate start-up of the cooling apparatus from a state in which the working fluid in the heat pipes has been frozen. The cooling apparatus has a block of a high heat conductivity in which one end of each heat pipe serving as an evaporation section of the heat pipe is embedded. Heat radiation fins are attached to portions of the heat pipes exposed from the block, so that the exposed portions of the heat pipes serve as condensation sections of the respective heat pipes. There are two types of heat radiation fins: a first type of fins which are attached to all the heat pipes and a second type of fins which are attached only to selected heat pipes.

19 Claims, 34 Drawing Sheets

HEAT-PIPE TYPE COOLING APPARATUS

BACKGROUND OF THE INVENTION

1. Field of the Invention

The present invention relates to a heat-pipe type cooling apparatus which is used for cooling, for example, semiconductor devices.

2. Description of the Related Art

In general, a heat-pipe type cooling apparatus for cooling semiconductor devices or the like employs a plurality of heat pipes. FIG. 36 illustrates an essential part of such a type of cooling apparatus. Since each heat pipe 1 has limited capacity for transporting heat, this type of cooling apparatus is so constructed that a plurality of heat pipes are connected to a common block which has excellent heat conductivity and to which the semiconductor device to be cooled is attached. When this type of cooling apparatus is charged with water as the working fluid, such working fluid is frozen when the ambient temperature has come down below 0° C. The cooling apparatus with frozen heat medium cannot perform expected function: namely, it may undesirably allow the semiconductor device to be heated beyond the maximum allowable temperature, e.g., 100° C. or higher.

Japanese Patent Unexamined Publication No. 2-229455 discloses a heat-pipe type cooling apparatus in which a plurality of heat pipes are grouped into two groups which are charged with different types of heat mediums. For instance, heat pipes of a first group is charged with freon R-113 as the working fluid, while the other is charged with pure water. Freon R-113 is not frozen even when the ambient temperature has come down below 0° C. and, hence, provides superior start-up characteristic even at low temperatures, as well as excellent performance at normal temperature during steady operation. Furthermore, the use of freon-type heat medium is not recommended from the view point of preservation of environment all over the earth.

A heat-pipe type cooling apparatus for cooling, for example, a semiconductor device is designed assuming the use in summer, i.e., maximum ambient air temperature of 40° C. or so, such that the semiconductor temperature is maintained not to exceed a predetermined standard temperature, e.g., 100° C. When the cooling apparatus is intended to be used also in winter season, the working fluid may be frozen depending on its type, when the same cooling apparatus is used also in winter season. For instance, when the ambient air temperature is as low as −30° C., the heat-pipe type cooling apparatus using water as the working fluid cannot be well started up because the water is frozen at such low temperature. As the semiconductor device starts to operate, heat is generated but the transportation of heat is commenced only after the solid phase of water, i.e. ice, is molten. If the heat dissipation capacity at the condenser is large for the air temperature, the working fluid is frozen again in the condenser, with the result that the working fluid does not return to the evaporating section. Consequently, the heat-pipe type cooling apparatus fails to operate due to shortage of liquid, allowing the semiconductor device to be overheated to a temperature beyond the maximum allowable temperature.

Thus, the known heat-pipe type cooling apparatus may not function as it cannot be started up due to freezing of the working fluid. In order that the heat-pipe type cooling apparatus is started at a temperature not higher than the freezing temperature of the working fluid, it is necessary to reduce the heat dissipation effect at the condensation section of the heat pipe.

SUMMARY OF THE INVENTION

Accordingly, an object of the present invention is to provide a heat-pipe type cooling apparatus in which the ability of the condensation section is reduced in, for example, winter, so as to enable smooth start-up of the heat pipe even from the state in which the working fluid has been frozen, while ensuring large heat transportation capacity.

To this end, according to one aspect of the present invention, there is provided a heat-pipe type cooling apparatus, comprising: a plurality of heat pipes; and a block which is made of a material having high heat conductivity and to which an object to be cooled is attached, each of the heat pipes having one end embedded in the block; the portions of the heat pipes exposed from the block being provided with heat radiation fins as heat dissipation means so as to constitute condensation sections of the heat pipes, wherein the improvement comprises that the heat pipes provided with the heat dissipation means are grouped into at least two groups, the heat pipes of different groups having different heat dissipation capacities.

The different heat dissipation capacities may be realized by designing such that different groups of heat pipes have different total areas of the heat radiation fins associated therewith.

The different heat dissipation capacities may be realized by designing such that the heat pipes of different groups have different lengths. In such a case, the heat pipes having the greater length may have heat radiation fins of greater area. Two different types of heat radiation fins may be used: the fins of a first type which is attached to all the heat pipes of the cooling apparatus, while the fins of a second type are attached only to selected heat pipes.

The different heat dissipation capacities also may be realized by arranging such that there are two types of the heat radiation fins, each the fin having holes penetrated by the heat pipes and sized to span all the heat pipes, and wherein, in the fin of one of the two types, the holes corresponding to selected heat pipes are enlarged to have inside diameter greater than the outside diameter of the heat pipe.

The heat-pipe type cooling apparatus may have spacers provided at the radially outer region of the fins so as to impede flow of air into the spaces between the fins.

The heat-pipe type cooling apparatus may be arranged such that the heat radiation fins are independently attached to each of the heat pipes, and wherein the heat pipes of different groups have different numbers of heat radiation fins attached thereto, so that the heat pipes of different groups have different heat dissipation capacities.

The heat-pipe type cooling apparatus also may be arranged such that the heat radiation fins are independently attached to each of the heat pipes, wherein the heat radiation fins attached to heat pipes of different groups are made of different materials.

The heat-pipe type cooling apparatus of the invention may be constructed such that the heat pipes of different groups are made of different materials.

The heat-pipe type cooling apparatus of the invention may be arranged such that the heat pipes of different groups have different inner surface configurations. In such a case, the arrangement may be such that each of the heat pipes of the first group has the inner surface provided with grooves extending in the longitudinal direction, and each of the heat pipes of second group has a smooth inner surface.

The heat-pipe type cooling apparatus of the invention may be constructed such that the heat pipes are grouped into at least two groups, the heat pipes of different groups being charged with different quantities of working fluid.

A coating of a water-repelling material may be formed on the inner surfaces of condensation sections of the heat pipes of one of the groups of heat pipes.

The heat-pipe type cooling apparatus of the invention may be constructed such that the heat radiation fins of different groups are made of different materials one of which is a shape memory alloy. The heat pipes of at least one of the groups may contain, in addition to a working fluid, an incompressible gas. The heat-pipe type cooling apparatus may further comprise at least one member disposed between two adjacent heat radiation fins, the member having a greater cross-section taken along the length of the heat pipes than the heat radiation fins and has a high heat conductivity so as to promote transportation of heat between different heat pipes. The above-mentioned member having high heat conductivity may be a stack of a plurality of the heat radiation fins closely laminated one on another. The member having high heat conductivity may also serves as a reinforcement member attached to the ends of the heat pipes.

The heat-pipe type cooling apparatus of the invention may be constructed such that the member having high heat conductivity serves as a part of a mounting frame attached to the cooling apparatus.

The heat-pipe type cooling apparatus of the invention may further comprise a heat generating member attached to the condensation sections of the heat pipes.

The heat-pipe type cooling apparatus of the invention may further comprise means for activating the heat generating member when the ambient air temperature or the temperature of the heat pipe has come down below a predetermined temperature.

The heat-pipe type cooling apparatus of the present invention may comprise a cooling blower for blowing air into the spaces between adjacent heat radiation fins to cool the heat radiation fins, and control means for controlling the operation of the cooling blower when the ambient air temperature or the temperature of the heat pipe has come down below a predetermined temperature.

The heat-pipe type cooling apparatus of the invention may further comprise a baffle plate for causing impediment to the flow of air into spaces between adjacent heat radiation fins. In such a case, means may be provided for altering the position of the baffle plate so that the baffle plate causes an impediment to the flow of air into the spaces between adjacent heat radiation fins when the ambient air temperature or the temperature of the heat pipe has come down below a predetermined temperature. The baffle plate may be attached to a housing which houses the cooling apparatus. The heat pipes may be bent so that the heat radiation fins extend in vertical direction. The object to be cooled may be an IGBT module or a GTO thyristor. The heat-pipe type cooling apparatus also can suitably be used for cooling a control system of a vehicle such as a railroad vehicle.

According to the present invention, by virtue of the features as set forth above, the heat dissipation capacity of the heat pipe constituting a part of the cooling apparatus can be set optimumly for the ambient air temperature and heat generation rate, so that the working fluid introduced into the condensation section of the heat pipe can be condensed without being cooled down to the freezing temperature, thus allowing the heat-pipe type cooling apparatus to be started up smoothly and to enter steady state of operation shortly after the start-up. When the temperature of the ambient air as the source of cold heat energy is low, it is not necessary that all the heat pipes of the cooling apparatus take part in the cooling operation. Furthermore, in order that required cooling performance of the cooling apparatus is secured without causing the working fluid to freeze, it is effective to design the apparatus such that a suitable number of heat pipes selected from among the heat pipes of the apparatus are designed to have smaller heat dissipation capacity than other heat pipes. Such a design enables the apparatus to operate over a wider range of temperature.

According to the present invention, the cooling apparatus may be so designed that the heat dissipation capacity of the cooling apparatus is reduced when the ambient air temperature is lowered. Such a design enables the cooling apparatus to effectively operate over a wider range of temperature. Furthermore, according to the present invention, the design may be such that the heat dissipation capacity of selected heat pipes is varied and optimumly set in relation to varying factors such as the ambient air temperature or thermal load, i.e., rate of generation of heat from the object to be cooled, and a member having a greater heat transportation capacity than heat radiating fins is used as the member for connecting adjacent heat pipes. According to this arrangement, in the event that the heat pipes having greater heat dissipation capacity has failed to start up due to freezing of the heat medium, such heat pipes can safely be re-started by the heat transmitted from other heat pipes, so as to be safely involved in the operation for lowering the temperature of the object to be cooled.

According to the present invention, the arrangement may be such that each heat pipe is provided at its condensation section with a heat generating member, and the rate of heat generation from this member is so controlled as to increase when the temperature at the condensation section or the ambient air temperature becomes lower, thereby preventing operation failure due to freezing of the working fluid inside the heat pipe.

DESCRIPTION OF THE PREFERRED EMBODIMENTS

Preferred embodiments of the present invention will be described with reference to the accompanying drawings.

Figure 1:
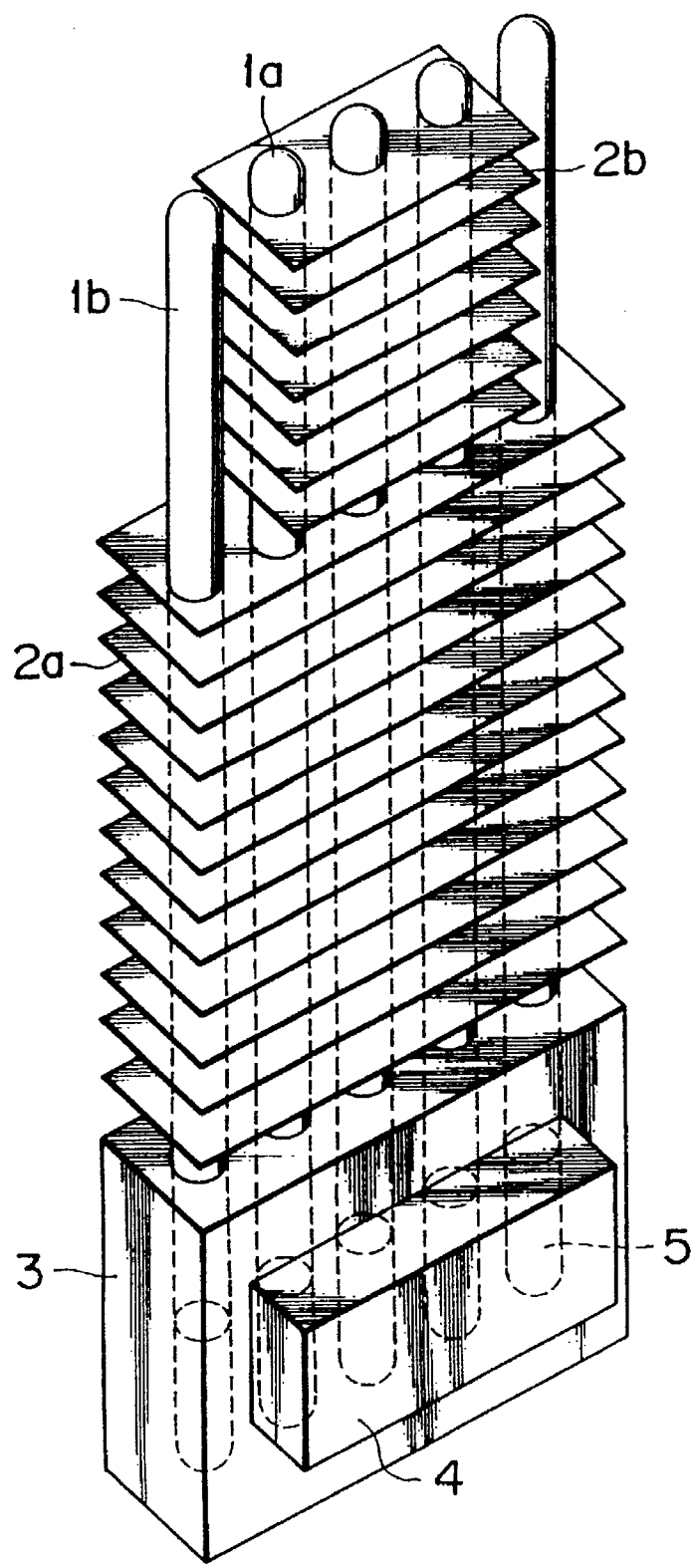
FIG. 1 is a perspective view of an embodiment of the cooling apparatus of the present invention.

FIG. 1 is a perspective view of an embodiment of the cooling apparatus of the present invention. As will be seen from this figure, an embodiment of the heat-pipe type cooling apparatus of the present invention is composed mainly of heat pipes 1a, 1b attached to a block 3, heat radiating fins 2a, 2b provided on the heat pipes 1a, 1b, and a cooling object, e.g., a semiconductor 4 provided on the block 3.

Each of the heat pipes 1a, 1b has a tubular member or pipe made of a material having high thermal conductivity, and is fabricated by baking the pipe material under vacuum, filling the pipe material with a small amount of working fluid 5 while degassing, and closing both ends of the pipe material. A plurality of heat pipes 1a, 1b, five pipes in this embodiment, are inserted at their one ends into corresponding holes formed in the block 3 which also is made of a material having a large heat conductivity. The portions of the heat pipes 1a, 1b received in the holes formed in the block 3 serve as evaporation sections of these heat pipes 1a, 1b. These evaporation sections of the heat pipes 1a, 1b are fixed to the block 3 by soldering or, alternatively, by pressure expansion, i.e., a technique in which the internal pressure of the pipes is increased so as to expand the ends of the pipes into close contact with the walls of the holes formed in the block.

The block 3 has a rectangular parallelopiped form. In this embodiment, the surfaces of the block 3 which are perpendicular to the plane of array of the heat pipes 1a, 1b are not used for cooling purpose. Namely, only the surfaces of the block 3 parallel to the array of the heat pipes 1a, 1b are used for the purpose of cooling. Thus, the cooling object such as the semiconductor 4 is secured to one of the surfaces of the block 3 parallel to the plane of array of the heat pipes 1a, 1b. A plurality of heat radiating fins 2a, 2b, each having a plurality of holes for receiving the heat pipes 1a, 1b, are provided on the condensation section of the heat pipes 1a, 1b such that the planes of these heat radiating fins 2a, 2b are perpendicular to the axes of the heat pipes 1a, 1b. In the illustrated embodiment, 19 fins are employed and arranged at a constant pitch. It will be seen that all the five heat pipes 1a, 1b are provided with the fins 2a, while the fins 2b are attached only to three heat pipes 1a. The heat radiating fins 2a, 2b are fixed to the heat pipes 1a, 1b by soldering or press-fitting. In order to promote circulation of the working fluid, the heat pipes are so arranged that the condensation section is above the evaporation section or that the heat pipes are laid horizontally. In some cases, however, the heat pipes are so arranged that the condensation section is at a level below the level of the evaporation section.

In operation, the cooling object such as the semiconductor 4 generates heat as it is supplied with electrical power. The heat thus generated is transmitted through the block 3 to the evaporation section of the heat pipes 1a, 1b embedded in the block 3. In the evaporation section of the heat pipes, the working fluid 5 inside the heat pipes is evaporated by the heat, and the vapor phase of the working fluid 5 thus generated moves together with the evaporation latent heat to the condensation section of the heat pipes 1a, 1b. In the evaporation section of the heat pipes 1a, 1b, the working fluid 5 is cooled as a result of heat dissipation from the heat radiating fins 2a, 2b; namely, the heat possessed by the vapor phase of the working fluid is transmitted to the inner surface of the heat pipe and then to the heat radiating fins 2a, 2b, whereby the working fluid 5 is condensed. The condensed working fluid 5 is returned to the evaporation section of the heat pipe by the force of gravity. When the inner surface of the heat pipe has been machined to produce a capillary action, returning of the working fluid 5 back to the evaporation section is promoted by such a capillary action. Thus, the heat carried away from the cooling object is transmitted by conduction through the wall of the heat pipe at the condensation section and then transmitted to the heat radiating fins from which the heat is dissipated to the air by natural cooling or by forced cooling effected by a blower.

In this embodiment, there are two types of heat radiation fins: namely, a first group of heat radiation fins 2a which are sized to be secured to all of five heat pipes and a second group of heat radiation fins 2b which are so sized as to be secured only to central three heat pipes. The heat radiation fins 2a of the first group are positioned closer to the evaporation section than the heat radiation fins 2b of the second group are. In other words, the heat radiation fins 2b of the second group are positioned closer to the condensation section of the heat pipes. Consequently, the central three heat pipes 1a have greater capacity of heat dissipation than that of the outer two heat pipes. It is therefore possible to vary the heat dissipation capacity without requiring any change in the pipe length. Although the cooling apparatus has been described to have five heat pipes and two groups of heat radiation fins, it is to be understood that these numbers of heat pipes and heat radiation fins are not exclusive, and may be determined freely.

The operation of the heat-pipe type cooling apparatus of this embodiment will be described with reference to FIGS. 2 to 5.

Figure 2:
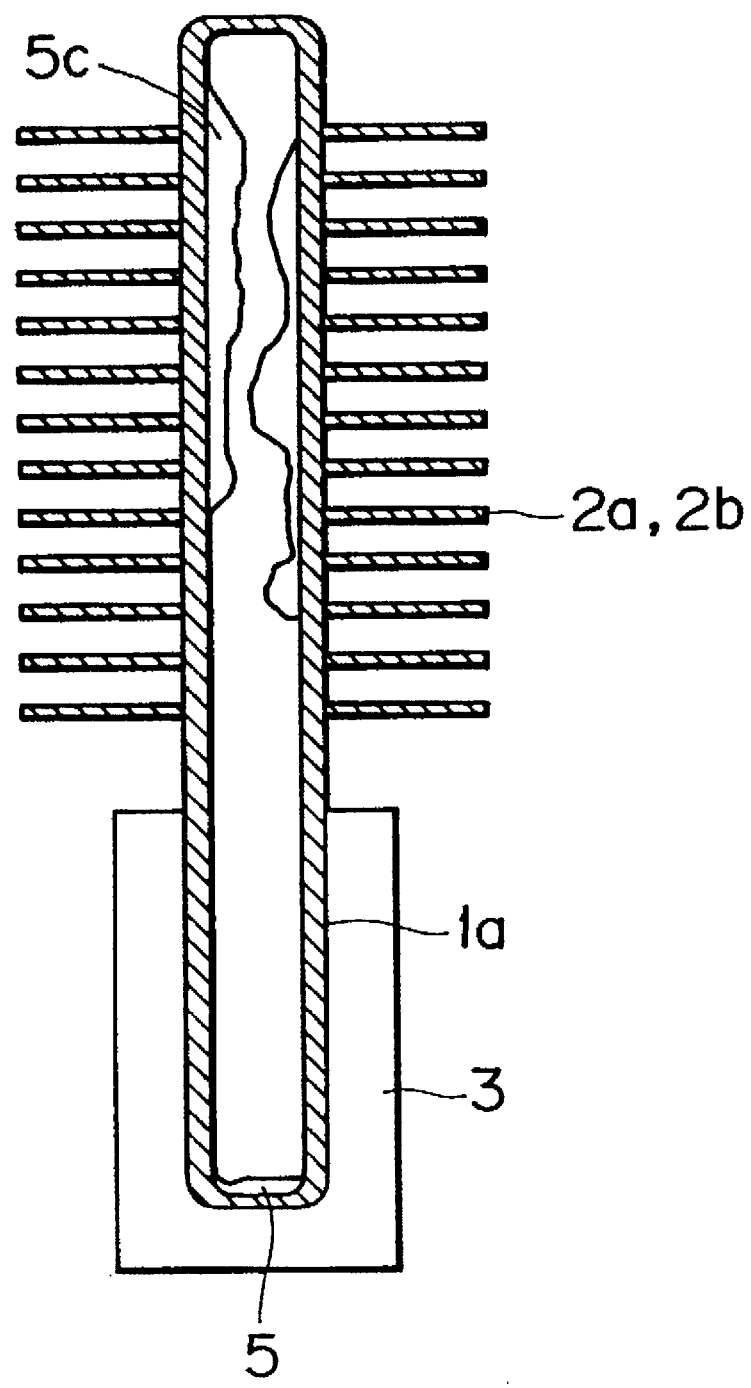
FIG. 2 is a sectional view of the heat-pipe type cooling apparatus, showing also the behavior of a working fluid inside heat pipes of the cooling apparatus.

FIG. 2 is a vertical sectional view of a cooling apparatus which has a heat dissipation capacity equivalent to a single central heat pipe 1a in the cooling apparatus of the embodiment. This figure also shows behavior of the working fluid in the heat pipe having the heat dissipation capacity equivalent to that of the single heat pipe 1a. An assumption is made here that the working fluid 5 is, for example, water, and that the working fluid 5 has been frozen in the evaporation section as the ambient air temperature is −30° C. An assumption is also made that the whole system is started up at a constant rate of heat input. The input heat causes the temperature of the frozen working fluid in the evaporation section to progressively rise, so that the frozen working fluid starts to melt and becomes vapor phase, so as to commence transportation of heat to the condensation section. The number of the heat radiating fins 2a, 2b attached to the heat pipe 1a is greater than the number of the heat radiating fins 2a attached to the heat pipe 1b which will be described later in connection with FIG. 4. Thus, the heat pipe 1a shown in FIG. 2 has a grater heat dissipation capacity than the heat pipe 1b shown in FIG. 4. Therefore, the working fluid is frozen again in the condensation section into solid phase 5c, causing shortage of the liquid phase of the working fluid in the evaporation section, thus causing impediment to returning of the working fluid to the evaporation section, resulting in operation failure of the heat pipe as illustrated in FIG. 2.

Figure 3:
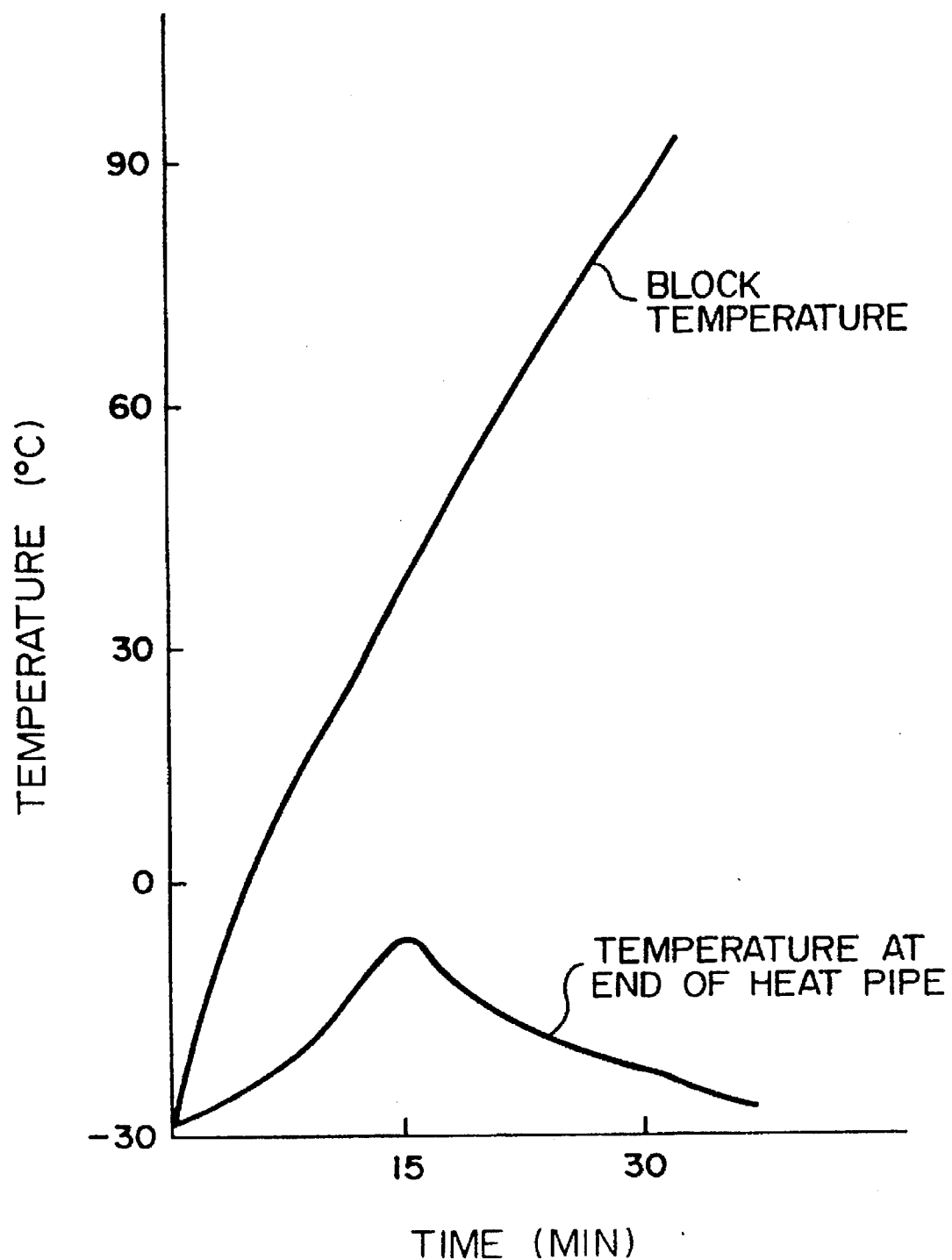
FIG. 3 is a graph showing a transient characteristics of the heat-pipe type cooling apparatus.

FIG. 3 shows changes in the temperatures at the end of the heat pipe and at the block portion in relation to time, setting to zero the moment of start of heat generation. The term "temperature at the end of the heat pipe" refers to the temperature of the end region of the heat pipe where the heat radiation fins are provided, while the term "temperature at the block portion" refers to the temperature measured at a fixed point on the external surface of the block in which the evaporation section of the heat pipes are embedded. The working fluid begins to melt after elapse of a certain time from the start of heat generation, whereby transportation of heat is commenced. The temperature at the end of the heat pipe is temporarily raised but starts to fall again due to freezing occurring in the condensation section. Once this freezing occurs, the heat pipe cannot be turned into steady operation, and terminate transportation of the heat, allowing a quick rise of the temperature of the whole block and a consequent overheat of the semiconductor device 4 to a temperature above the maximum allowable temperature which is, for example, 100° C.

Figure 4:
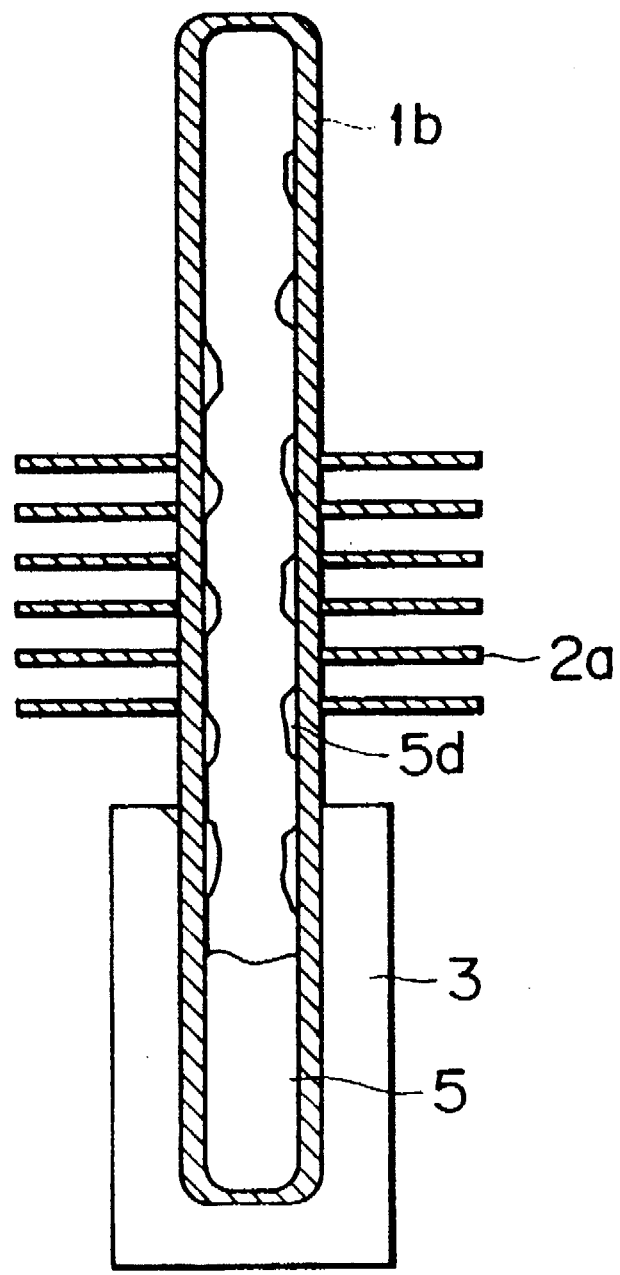
FIG. 4 is a sectional view of the heat-pipe type cooling apparatus, showing also the behavior of a working fluid inside heat pipes of the cooling apparatus.

FIG. 4 is a vertical sectional view of the aforementioned cooling apparatus having condensation capacity corresponding to that of a single heat pipe 1b of the type which is disposed on each outer end of the five heat pipes used in the embodiment. This figure also shows behavior of the working fluid within the heat pipe. As in the case of the cooling apparatus described in connection with FIG. 2, an assumption is made here that water is used as the working fluid, and that the working fluid has been frozen in the evaporation section as the ambient air temperature is as low as −30° C. It is also assumed that the cooling apparatus is started by input of heat at a constant rate. In the period immediately after the start of the cooling apparatus, the temperature rises in the evaporation section where the working fluid has been frozen, so that the frozen working fluid starts to melt and evaporate into vapor phase, thus commencing transportation of heat to the condensation section. In this case, only one type of heat radiation fins, i.e., fins 2a, are attached to the heat pipe 1b. Therefore, the heat pipe 1b shown in FIG. 4 has a smaller heat dissipation capacity than the heat pipe 1a shown in FIG. 2, so that the evaporated working fluid in the heat pipe 1b can return to the evaporation section without freezing in the condensation section. In this case, therefore, the working fluid condensed into liquid phase as denoted by 5d can steadily and continuously return to the evaporation section as will be seen from FIG. 4, whereby the heat pipe can operate without shortage of liquid phase of the working fluid.

Figure 5:
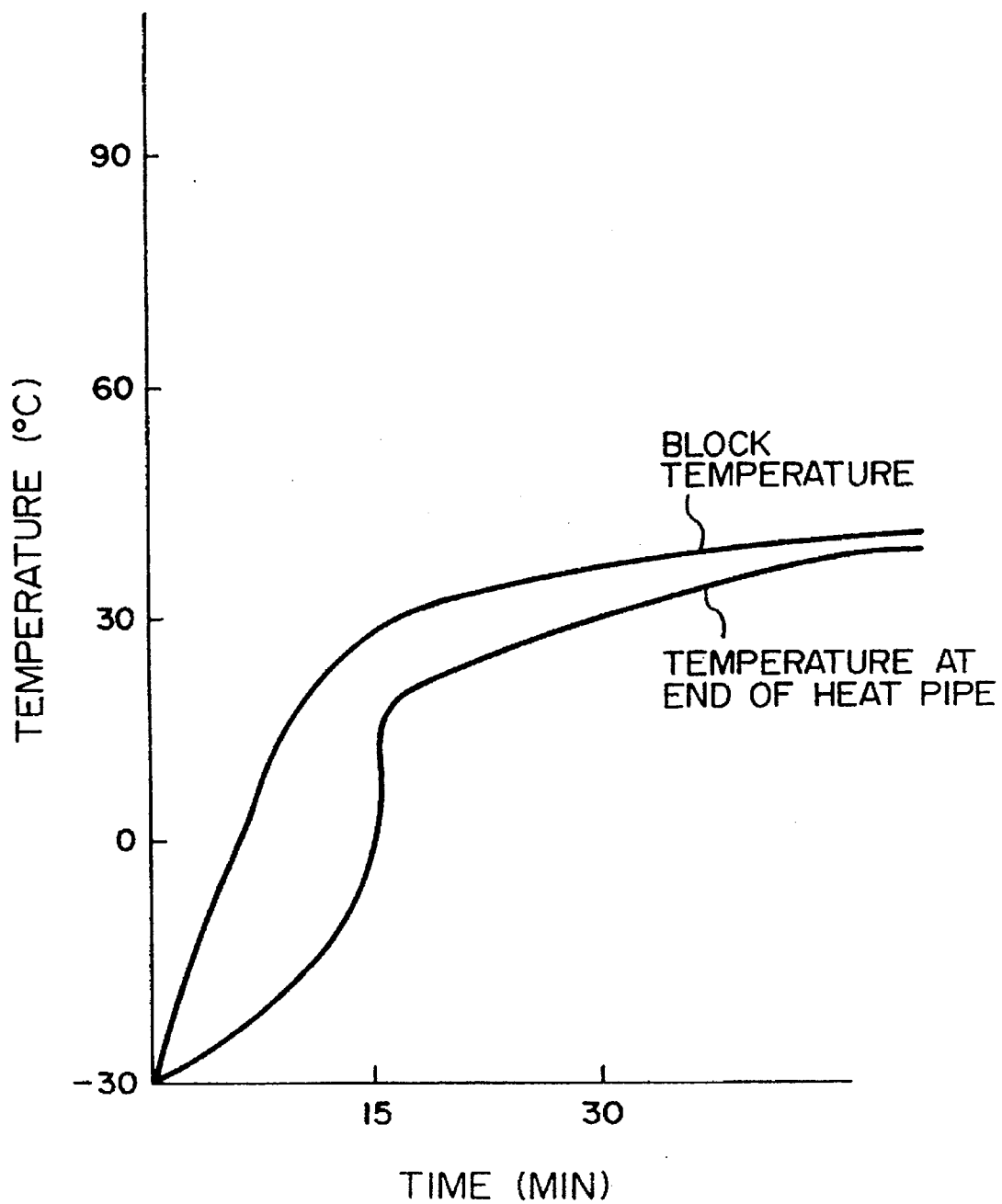
FIG. 5 is a graph showing transient characteristic of the heat-pipe type cooling apparatus.

FIG. 5 illustrates changes in the temperature at the end of the heat pipe and at the block portion in relation to time, setting to zero the moment at which the heat generation was started. After elapse of a certain time from the start of heat generation, the working fluid begins to melt to commence transportation of heat. The temperature at the end of the heat pipe is quickly raised to a level almost equal to that of the block portion. Since the heat pipe continues to operate in this manner, the temperature of the block portion is settled to a steady level.

As will be understood from the foregoing description, the illustrated embodiment employs a plurality of types of heat pipes in combination. When, for example, water is used as the working fluid, the heat pipes 1b having smaller heat dissipation capacity are started first when the ambient air temperature is so low as to cause freezing of the working fluid, so that the cooling apparatus can effectively operate to provide required cooling performance, whereas, when the ambient air temperature is not so low as to cause freezing, all the heat pipes 1a, 1b are started from the beginning so as to provide the required cooling effect. Thus, the described cooling apparatus of the invention can operate over a wider range of temperature.

Figure 6:
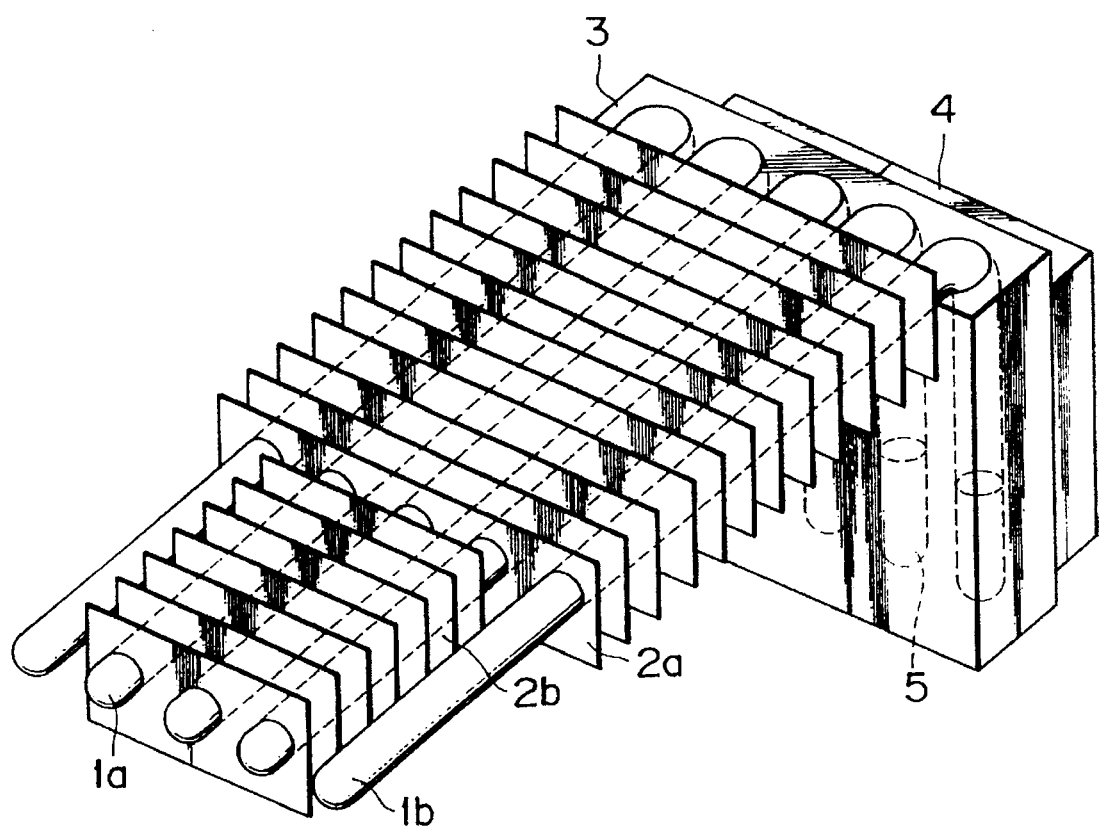
FIG. 6 is a perspective view of another embodiment of the cooling apparatus.

A description will now be given of a cooling apparatus as another embodiment of the invention, with reference to FIG. 6 which is a perspective view of this embodiment.

The construction of this embodiment is substantially the same as that of the embodiment shown in FIG. 1, except that the heat pipes 1a, 1b are bent through about 90° at portions thereof between the block 3 and the heat radiating fins 2a, 2b, in the direction opposite to the surface which mounts the semiconductor 4.

In this embodiment, the heat radiating fins 2a, 2b can extend vertically even when the evaporation section of the heat pipes is mounted vertically, so that the flow of air into the spaces between adjacent fins is promoted to provide a greater effect of heat dissipation due to natural convection. The angle at which the heat pipes are bent is not limited to 90° or so but any desired angle of bend can be adopted such that the heat radiation fins extend substantially vertically, according to the manner of installation of the cooling apparatus.

Figure 7:
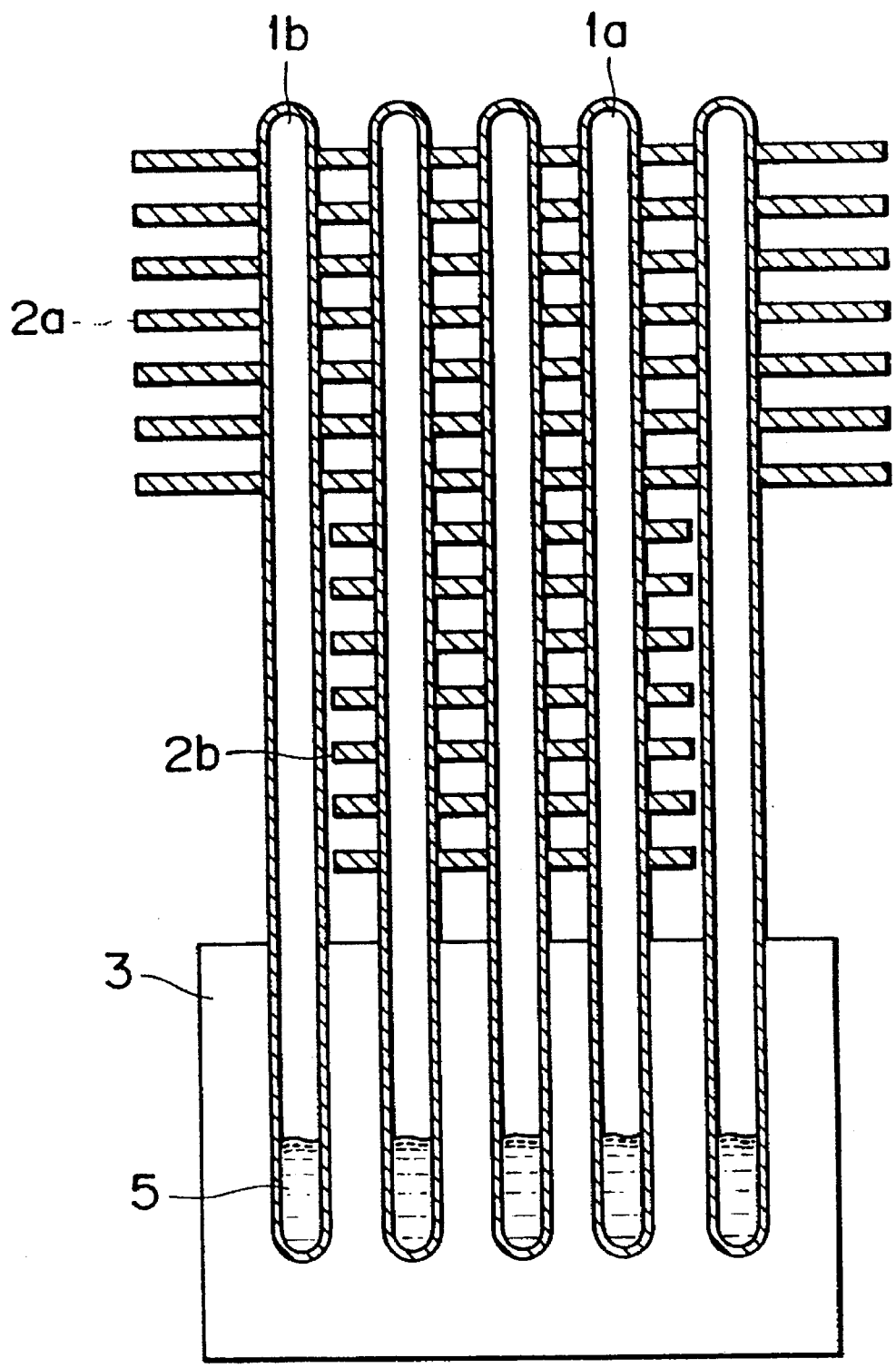
FIG. 7 is a vertical sectional view of still another embodiment of the cooling apparatus.

A cooling apparatuses embodying the present invention will be described with reference to FIGS. 7 and 8 which are vertical sectional views of these cooling apparatuses. The construction of these embodiments are substantially the same as that of the embodiment described before in connection with FIG. 1, except that the heat radiation fins $2a$ attached to all the heat pipes are disposed apart from the evaporation sections of the heat pipes, while the heat radiation fins $2b$ which are secured only to selected heat pipes are disposed closer to the evaporation sections of the heat pipes.

Figure 8:
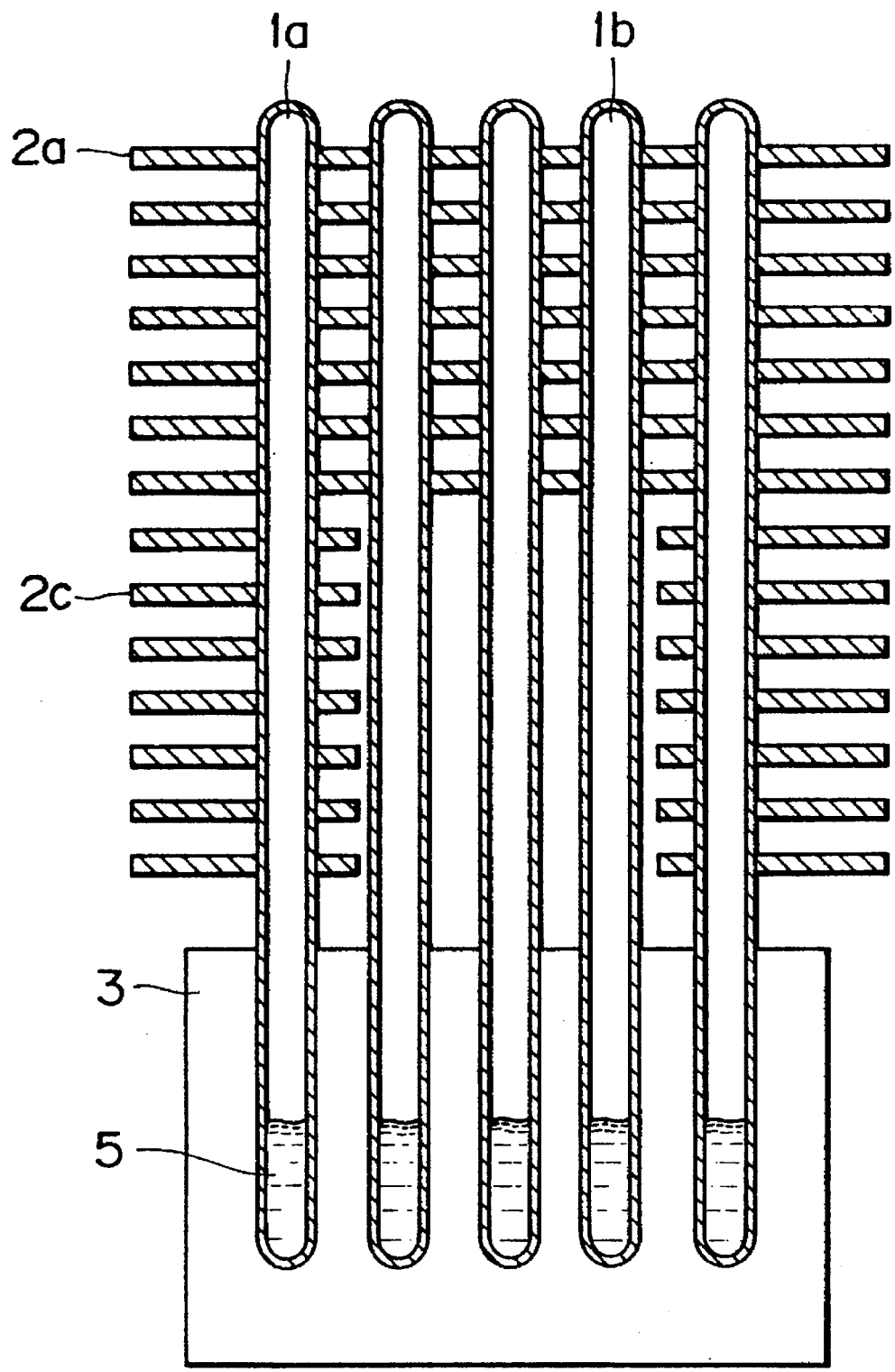
FIG. 8 is a vertical sectional view of a further embodiment of the cooling apparatus.

In particular, in the embodiment shown in FIG. 8, the heat radiation fins adjacent to the evaporation sections of the heat pipes are provided not on the central heat tubes but on each of the outer heat pipes independently.

According to this arrangement shown in FIG. 8, the central heat pipes and the outer heat pipes perform functions which are performed by the outer and central heat pipes in the embodiment shown in FIG. 1, respectively, but the effect produced by this arrangement is equivalent to that achieved by the embodiment shown in FIG. 1.

Figure 9:
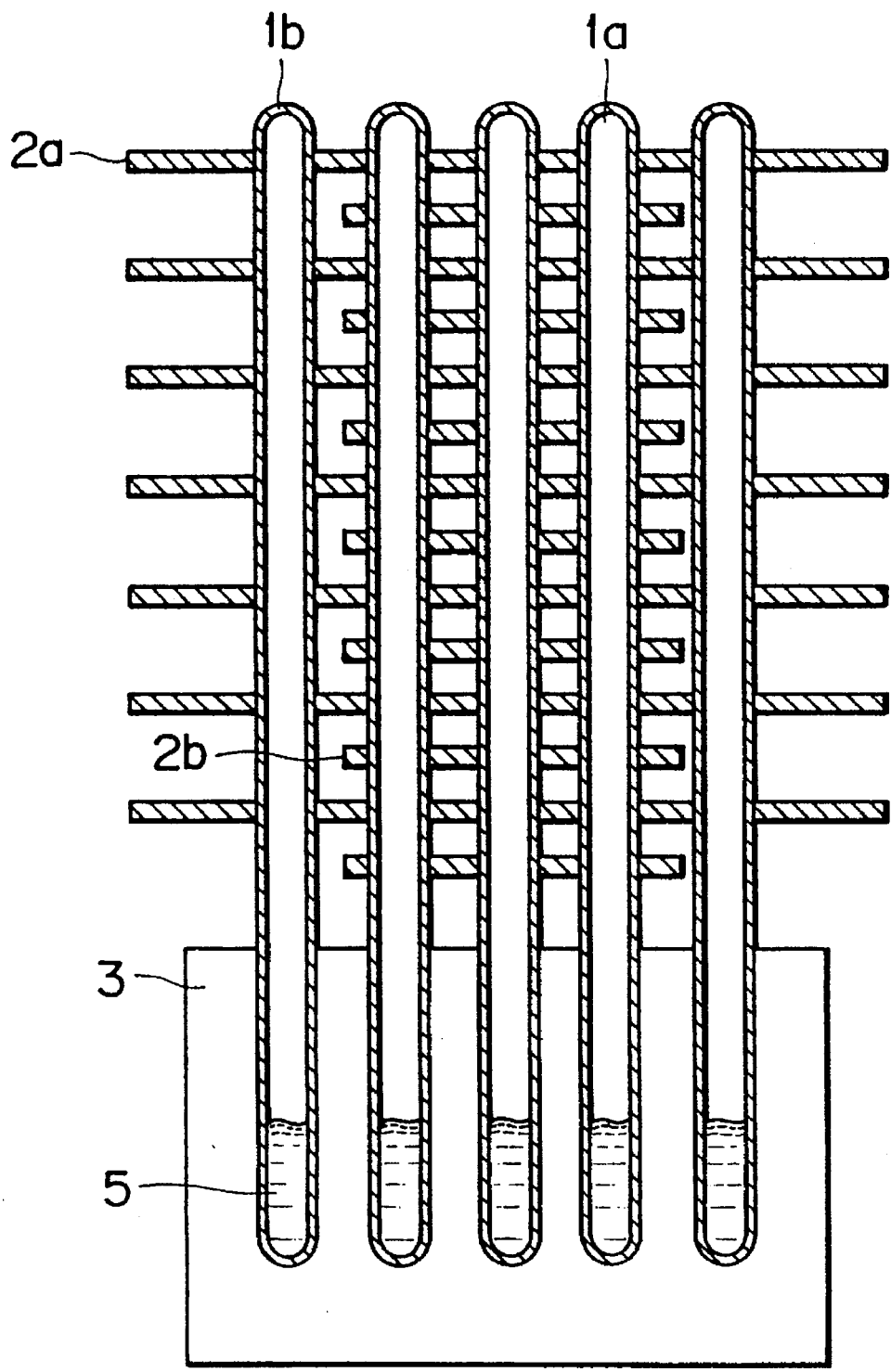
FIG. 9 is a vertical sectional view of a still further embodiment of the cooling apparatus of the present invention.

Different cooling apparatuses embodying the present invention will be described with reference to FIGS. 9 and 10 which are vertical sectional views of such cooling apparatuses.

The arrangements of these embodiments are substantially the same as that of the embodiment described before in connection with FIG. 1. In the embodiment shown in FIG. 9, however, the heat radiating fins $2a$, $2b$ are attached to the heat pipes $1a$, $1b$ in an alternating or staggered manner along the length of the heat pipes $1a$, $1b$. In the embodiment shown in FIG. 10, the heat radiation fins $2a$ are attached to all the heat pipes, and each of the two outer heat pipes is provided with independent heat radiation fins $2c$ arranged such that the heat radiation fins $2a$ and the heat radiation fins $2c$ appear alternately along the length of the heat pipe.

Figure 10:
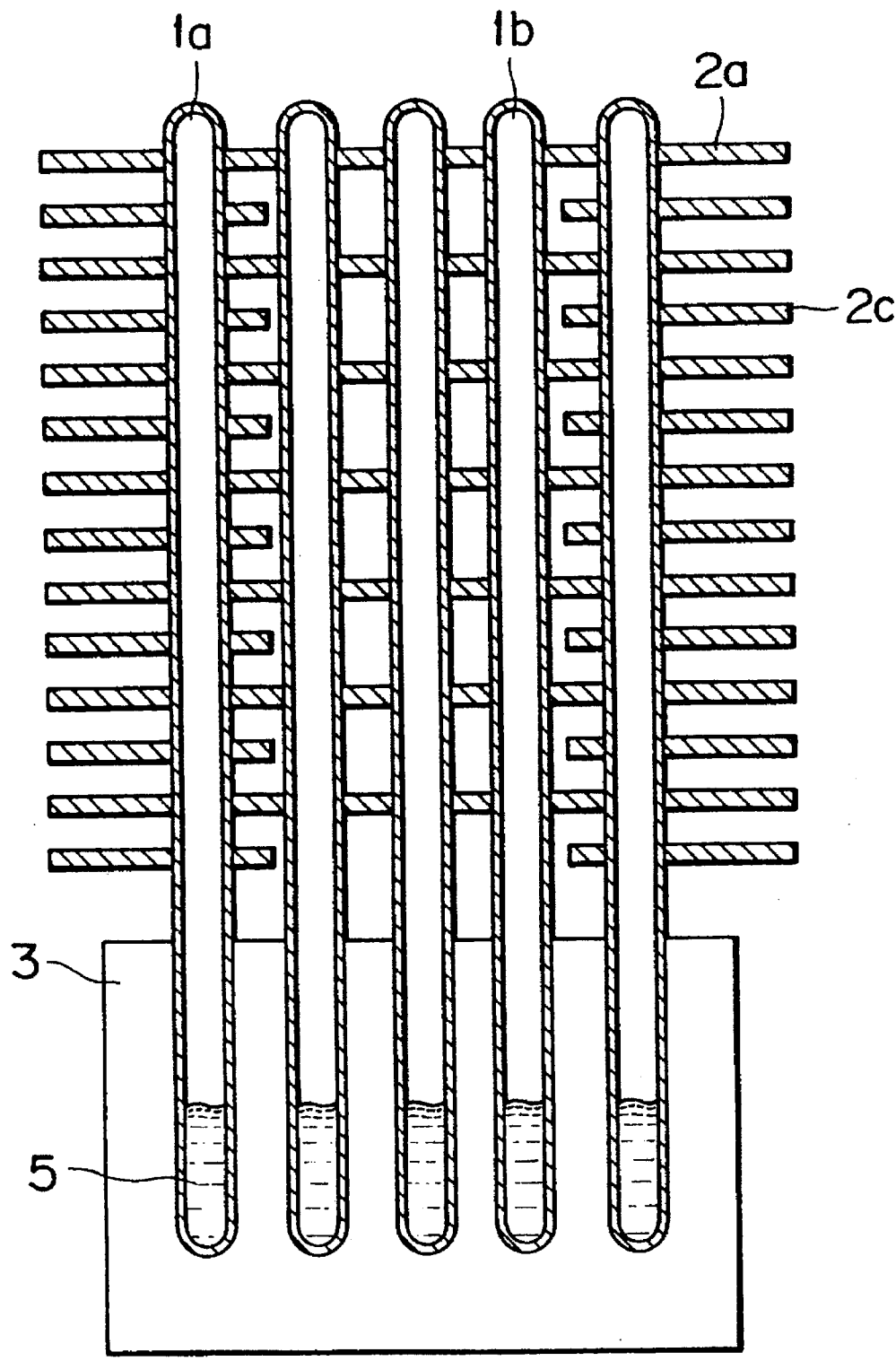
FIG. 10 is a vertical sectional view of a yet further embodiment of the cooling apparatus of the present invention.

According to this arrangement shown in FIG. 10, the central heat pipes and the outer heat pipes perform functions which are performed by the outer and central heat pipes in the embodiment shown in FIG. 1, respectively, but the effect produced by this arrangement is equivalent to that achieved by the embodiment shown in FIG. 1.

Different embodiments of the present invention will be described with reference to FIGS. 11 to 15 which are vertical sectional views of the cooling apparatuses embodying the present invention. These embodiments have a common feature in that the length of the condensation section of the heat pipes is varied according to the position of the heat pipe. Namely, in the embodiment shown in FIG. 1, the length of the condensation section of the two outer heat pipes $1c$ is smaller than that of the central three heat pipes $1a$. Heat radiation fins 2 which are sized to be large enough to cover all these heat pipes are secured to the condensation sections of the heat pipes $1a$, $1c$. Consequently, the two outer heat pipes $1c$ carry a smaller number of heat radiation fins than that carried by the central three heat pipes $1a$, due to the fact that the condensation sections of the outer heat pipes $1c$ have a smaller length than those of the central three heat pipes $1a$. It will be seen that, according to this arrangement, two outer heat pipes $1c$ exhibit smaller heat dissipation capacity than the three central heat pipes $1a$. It is thus possible to realize a cooling apparatus employing heat pipes of different heat dissipation capacities, using only one type of heat radiation fins, by employing heat pipes of different lengths.

Figure 11:
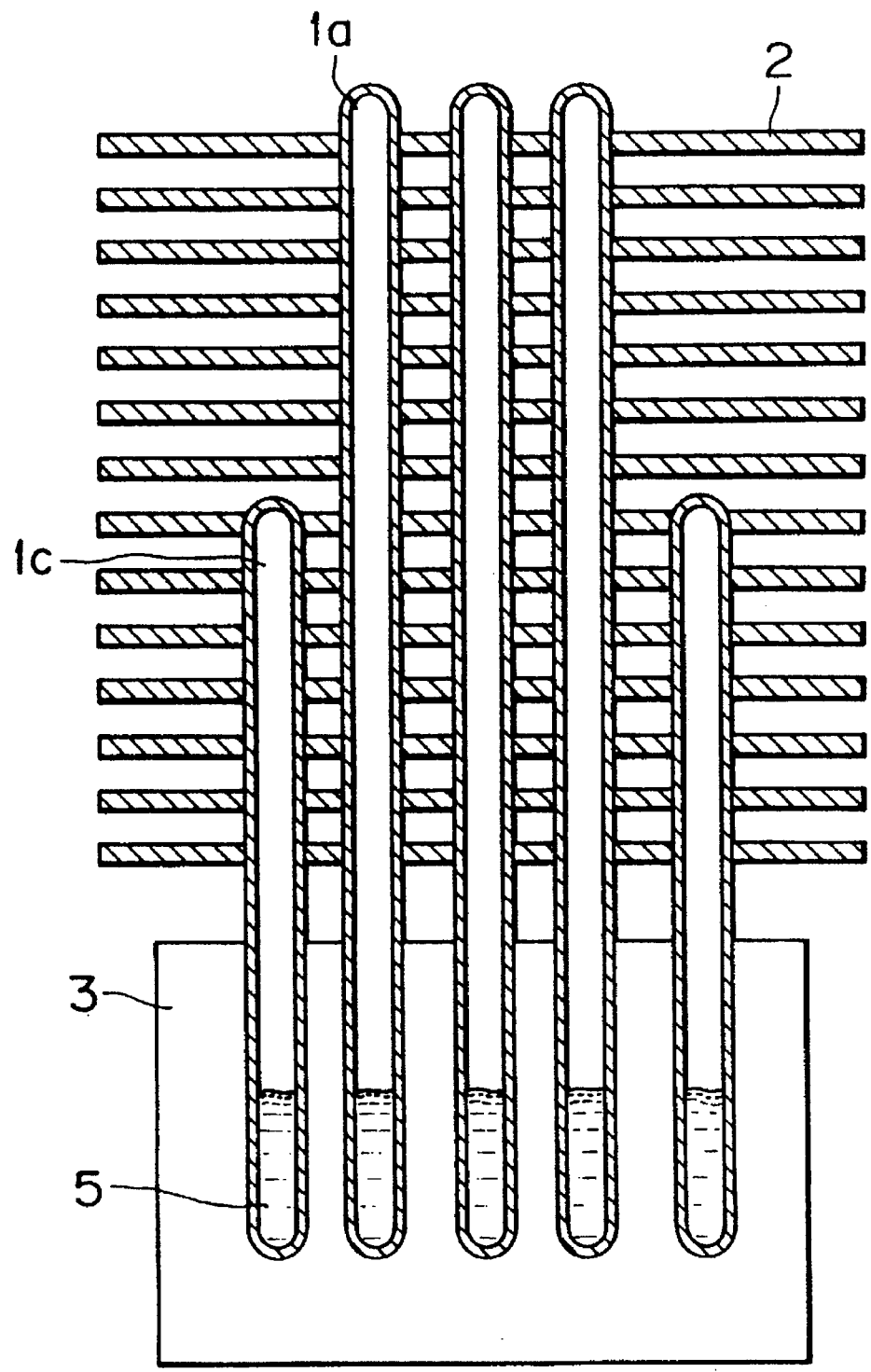
FIG. 11 is a vertical sectional view of a different embodiment of the cooling apparatus of the present invention.
Figure 12:
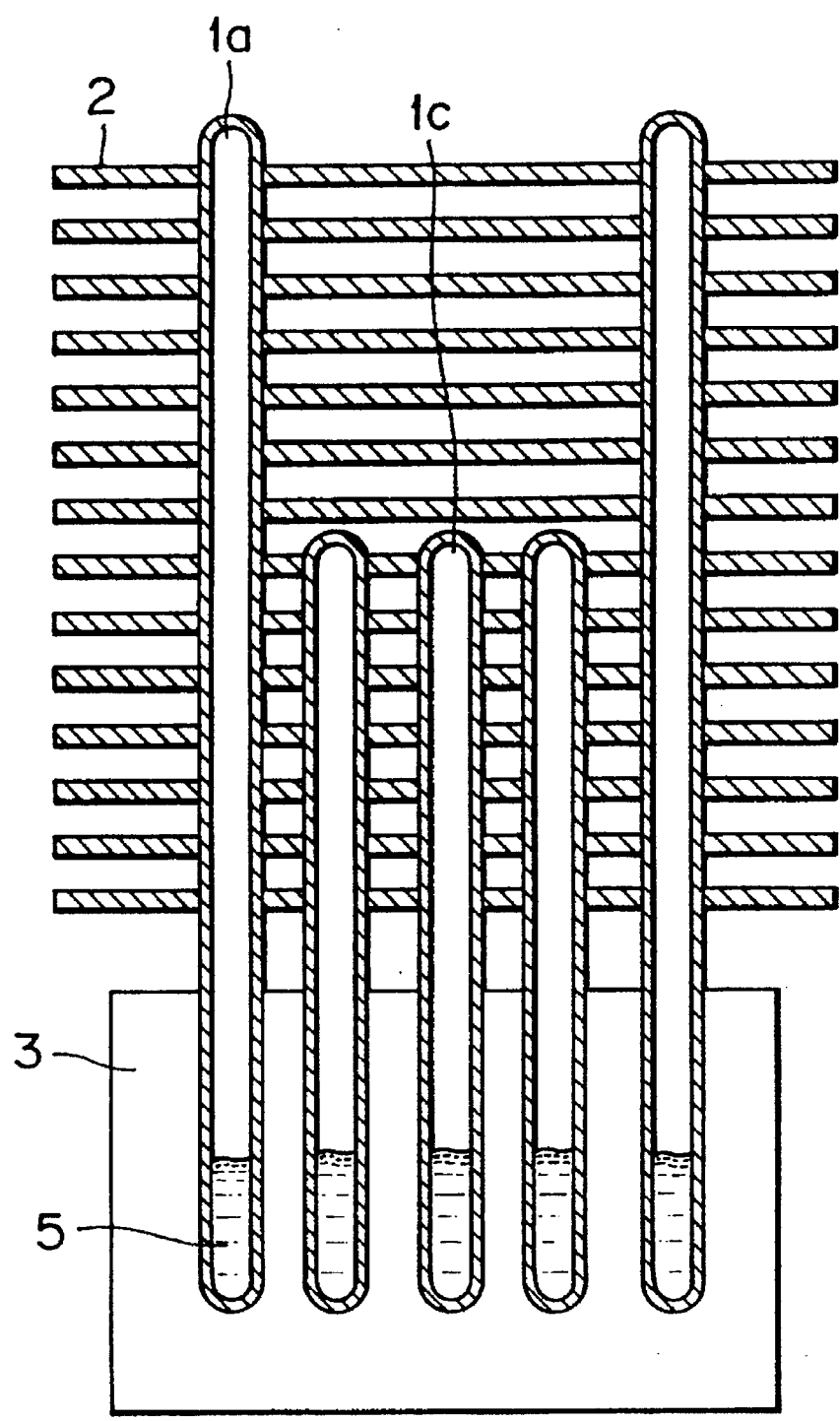
FIG. 12 is a vertical sectional view of a different embodiment of the cooling apparatus of the present invention.

The embodiment shown in FIG. 12 has two outer heat pipes $1a$ having a greater length of condensation section and three central heat pipes $1c$ having smaller length of condensation section. The arrangements of the heat pipes having different lengths of condensation section as shown in FIGS. 11 and 12 are only illustrative and may be varied freely.

Figure 13:
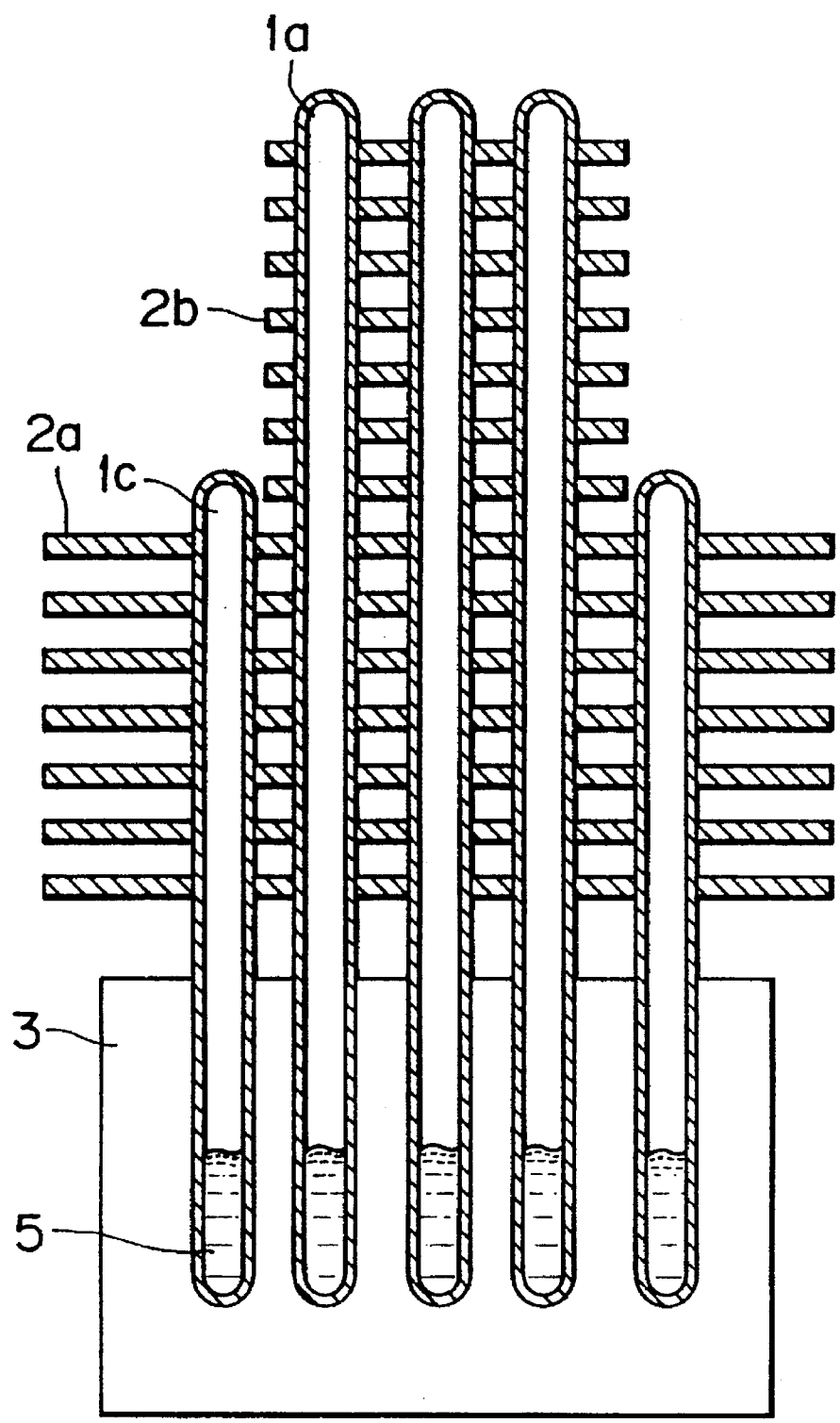
FIG. 13 is a vertical sectional view of a different embodiment of the cooling apparatus of the present invention.

FIG. 13 illustrates an embodiment which is similar to that shown in FIG. 11. In this embodiment, however, the heat radiation fins $2a$ adjacent to the evaporation section are attached to all the heat pipes $1a$, $1c$, and a group of heat radiation fins $2b$ sized just to span the central three heat pipes $1a$ are attached to the ends of the three central heat pipes $1a$. It will be understood that this arrangement reduces overall dimensions of the cooling apparatus.

Figure 14:
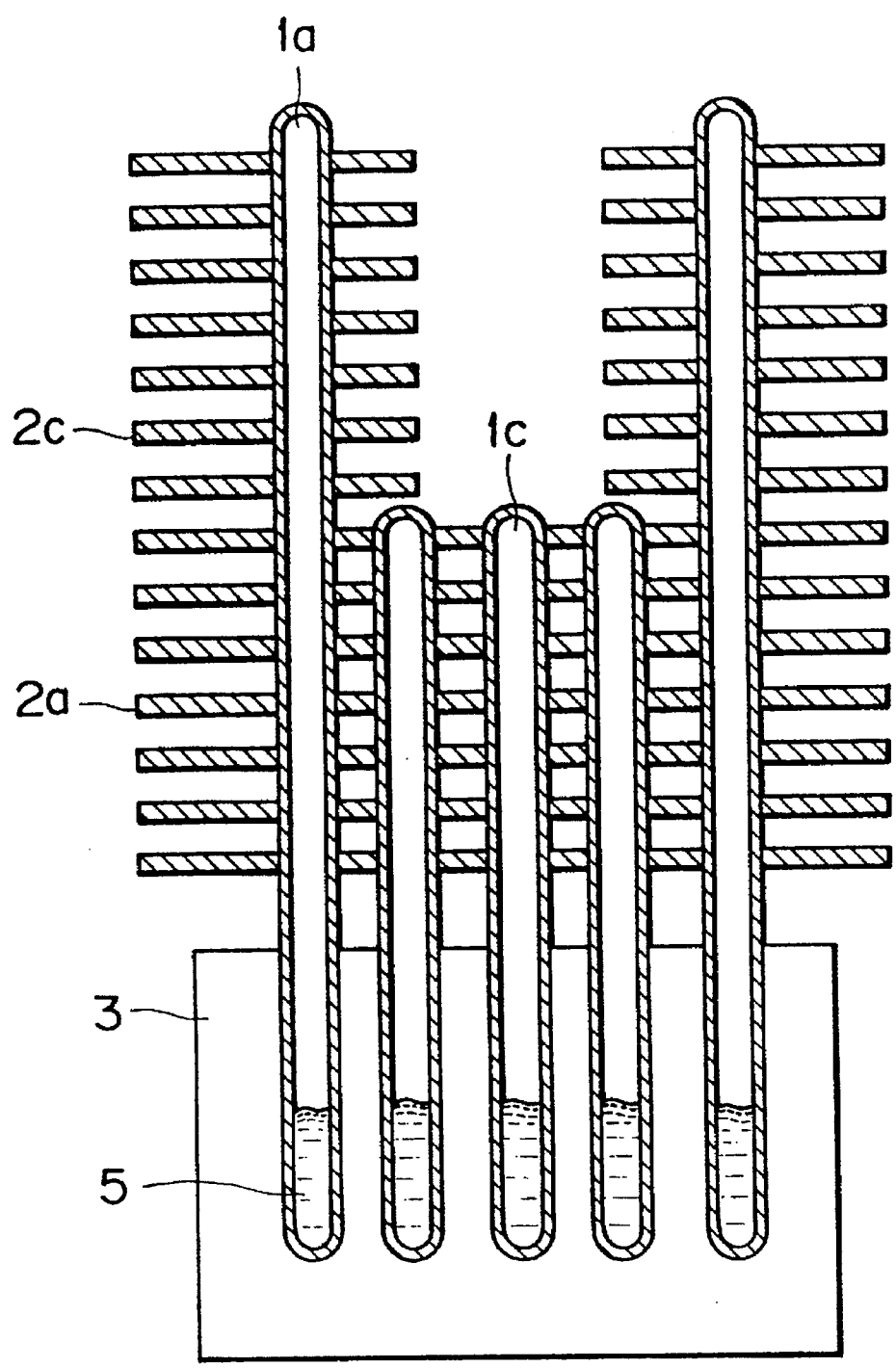
FIG. 14 is a vertical sectional view of a different embodiment of the cooling apparatus of the present invention.

The embodiment shown in FIG. 14 is similar to the embodiment described before in connection with FIG. 12. In this embodiment, the heat radiation fins $2a$ are attached to all the heat pipes $1a$, $1c$, and heat radiation fins $2c$ are attached only to the heat pipes $1a$ which are located on both outer sides of the group of heat pipes $1c$. The heat pipes $1a$ may have different numbers of independent heat radiation fins $2c$.

Figure 15:
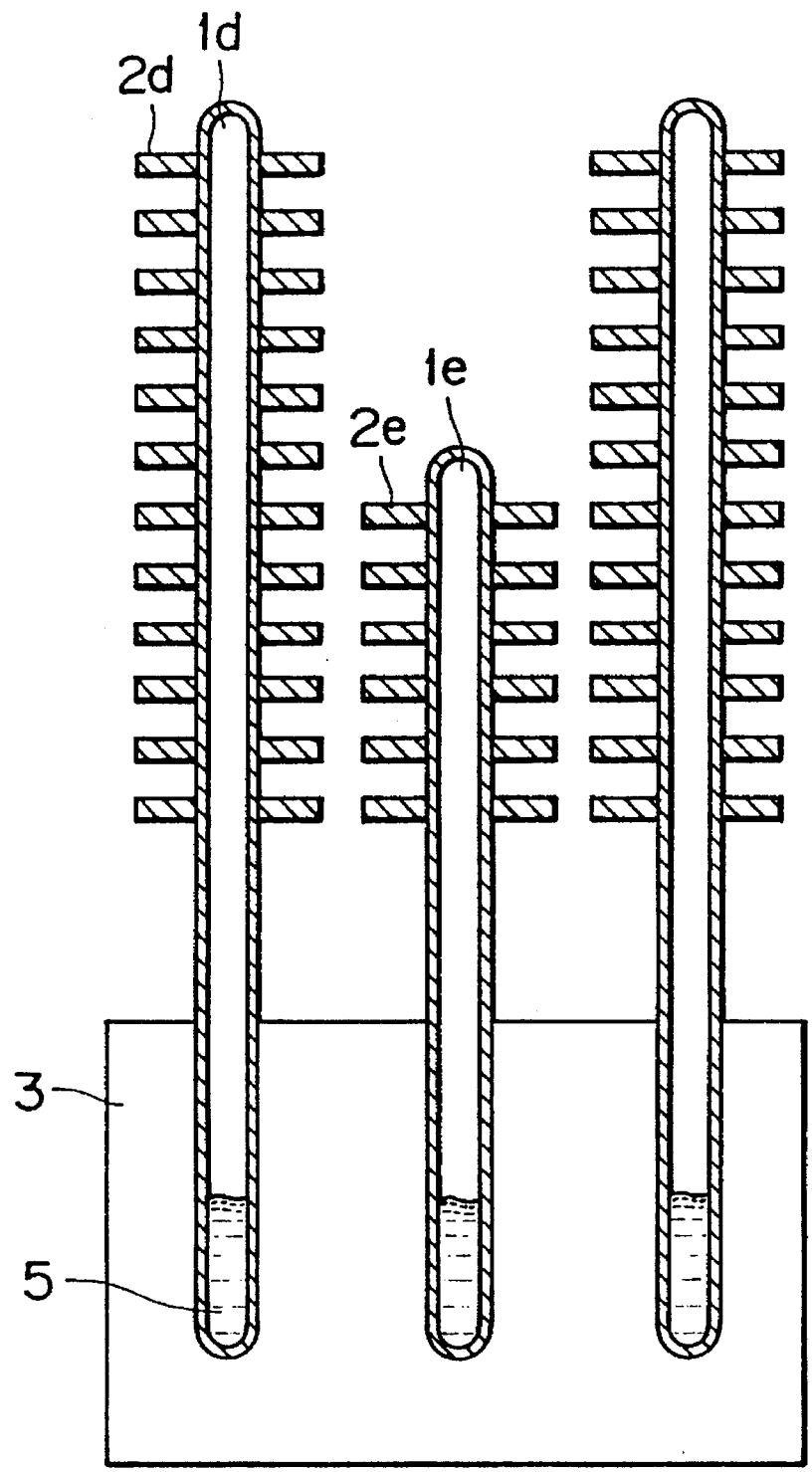
FIG. 15 is a vertical sectional view of a different embodiment of the cooling apparatus of the present invention.

The embodiment shown in FIG. 15 employs three heat pipes $1d$, $1e$ which are embedded at their one ends in the block 3. Independent fins $2d$, $2e$ are attached to each of these heat pipes. According to this arrangement, it is possible to arbitrarily select the number of the heat radiation fins and the material of such fins, because different heat pipes can have different heat dissipation capacities. Namely, the number of the fins may be varied according to the heat pipe and the material of the fins may be also varied, such that the fins attached to the heat pipe $1d$ is made of copper while the fins attached to the heat pipe $1e$ are made of aluminum.

A different embodiment of the cooling apparatus of the present invention will be described with reference to FIG. 16 which is a vertical sectional view of this cooling apparatus.

Figure 16:
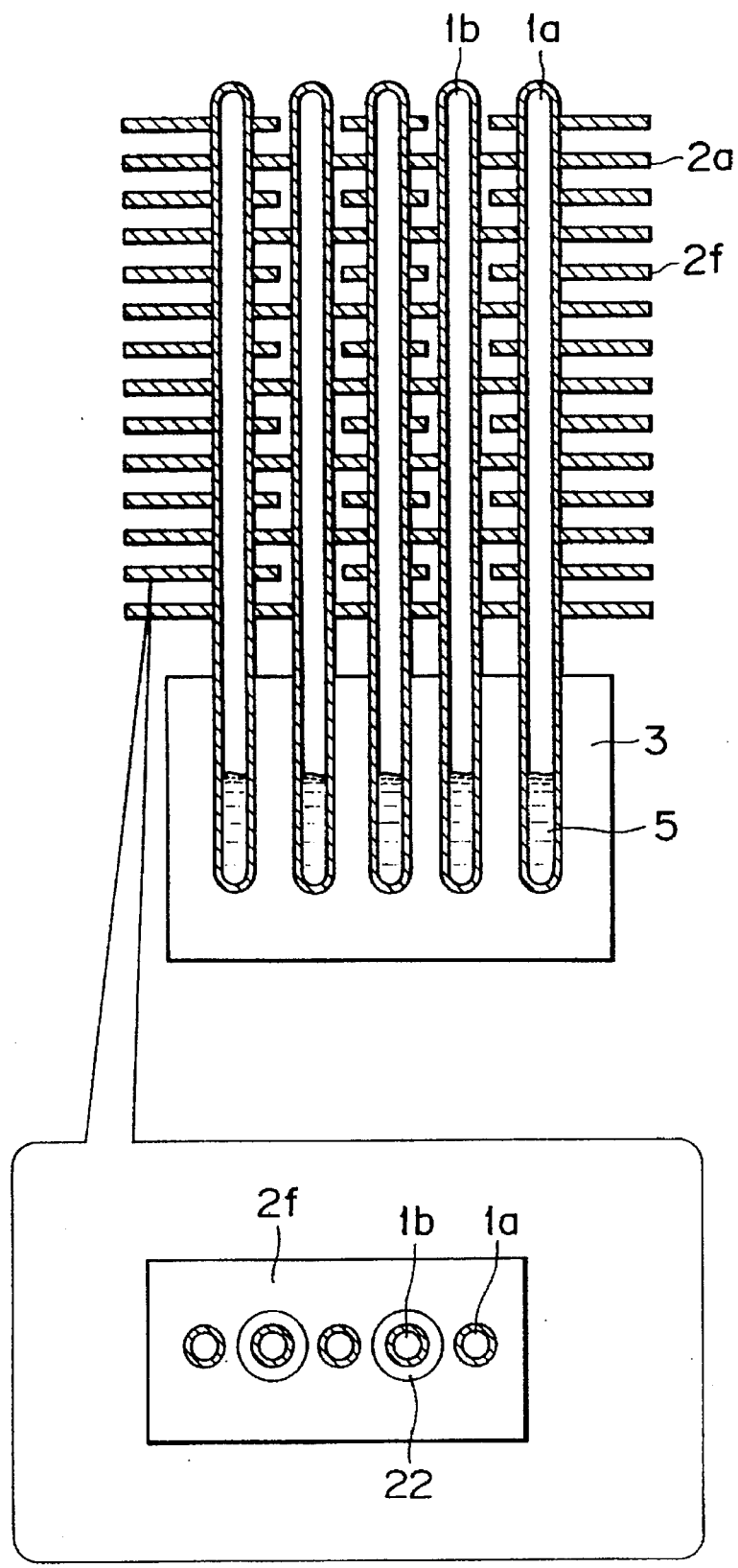
FIG. 16 is a vertical sectional view of a different embodiment of the cooling apparatus of the present invention, showing part of the apparatus in side elevation at a greater scale.

As will be understood from FIG. 16, this embodiment employs two types of heat radiation fins $2a$, $2f$ having the same outside diameter. As will be seen from a view in the vertical direction which is given at the lower end of FIG. 16, however, one type of heat radiation fins $2f$ are so configured that the holes formed therein corresponding to two heat pipes $1b$ out of five are enlarged to have inside diameter greater than the outside diameter of these heat pipes $1b$. Namely, annular gaps 22 are formed between each such heat pipe $1b$ and the fin $2f$. Consequently, almost no heat transfer takes place from the heat pipe $1b$ to the heat radiation fin $2f$, so that the heat pipe $1b$ has a smaller heat dissipation capacity than the heat pipe $1a$.

In this embodiment, the above-mentioned heat radiation fins $2f$ and the other type of heat radiation fins $2a$ which are secured to all the heat pipes are arranged such that these two types of fins appear alternately along the length of the heat pipes. It is not always necessary that the number and the positions of the enlarged holes are the same for all the fins $2f$. Thus, in this embodiment, heat pipes of the same length are used but the heat dissipation capacity is varied according to the heat pipe, as a result of use of two types of heat radiation fins which have an identical outside diameter but are configured to have selectively enlarged heat-pipe receiving holes.

The arrangement of plurality of types of heat radiation fins employed in the described embodiments are not exclusive. Moreover, the arrangement of these fins may not be regular.

Figure 17:
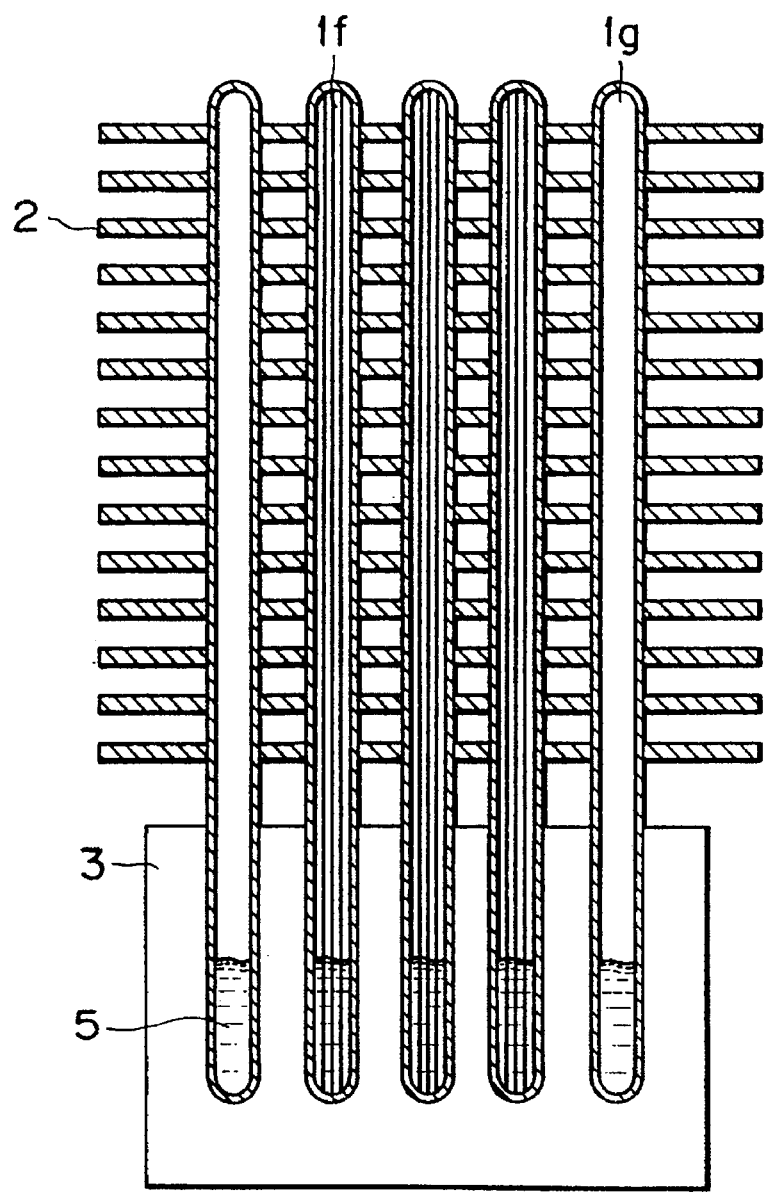
FIG. 17 is a vertical sectional view of a different embodiment of the cooling apparatus of the present invention.
Figure 18:
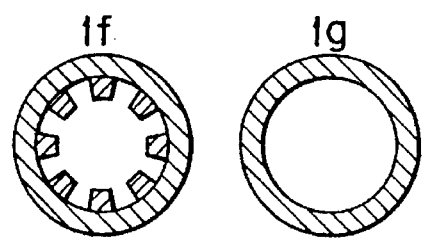
FIG. 18 is a cross-sectional view of a heat pipe shown in FIG. 17.

Different cooling apparatuses embodying the present invention will be described with reference to FIGS. 17 to 21. FIG. 17 is a vertical sectional view of the embodiment of the present invention, FIG. 18 is a cross-sectional view of each of the heat pipes 1f, 1g employed in the cooling apparatus shown in FIG. 17, and FIGS. 19 to 21 are vertical sectional views of different embodiments of the cooling apparatus of the present invention.

Referring first to FIG. 17, the cooling apparatus employs five heat pipes, including three inner or central heat pipes if and two heat pipes 1g which are arranged on both outer sides of the group of heat pipes. Each of the three central heat pipes if has a plurality of flutes or grooves formed in the inner surface thereof along the length of the heat pipe, while each of the two outer heat pipes 1g has a smooth inner surface. A plurality of heat radiation fins 2 are commonly secured to all the heat pipes 1f, 1g. FIG. 18 shows, in cross-section, each of these two types of heat pipes 1f, 1g. Apparently, the heat pipe 1f having grooves formed therein exhibits greater condensation capacity than the heat pipe 1g having smooth inner surface. It is thus possible to control the performance of the heat pipes at the condensation section.

Figure 19:
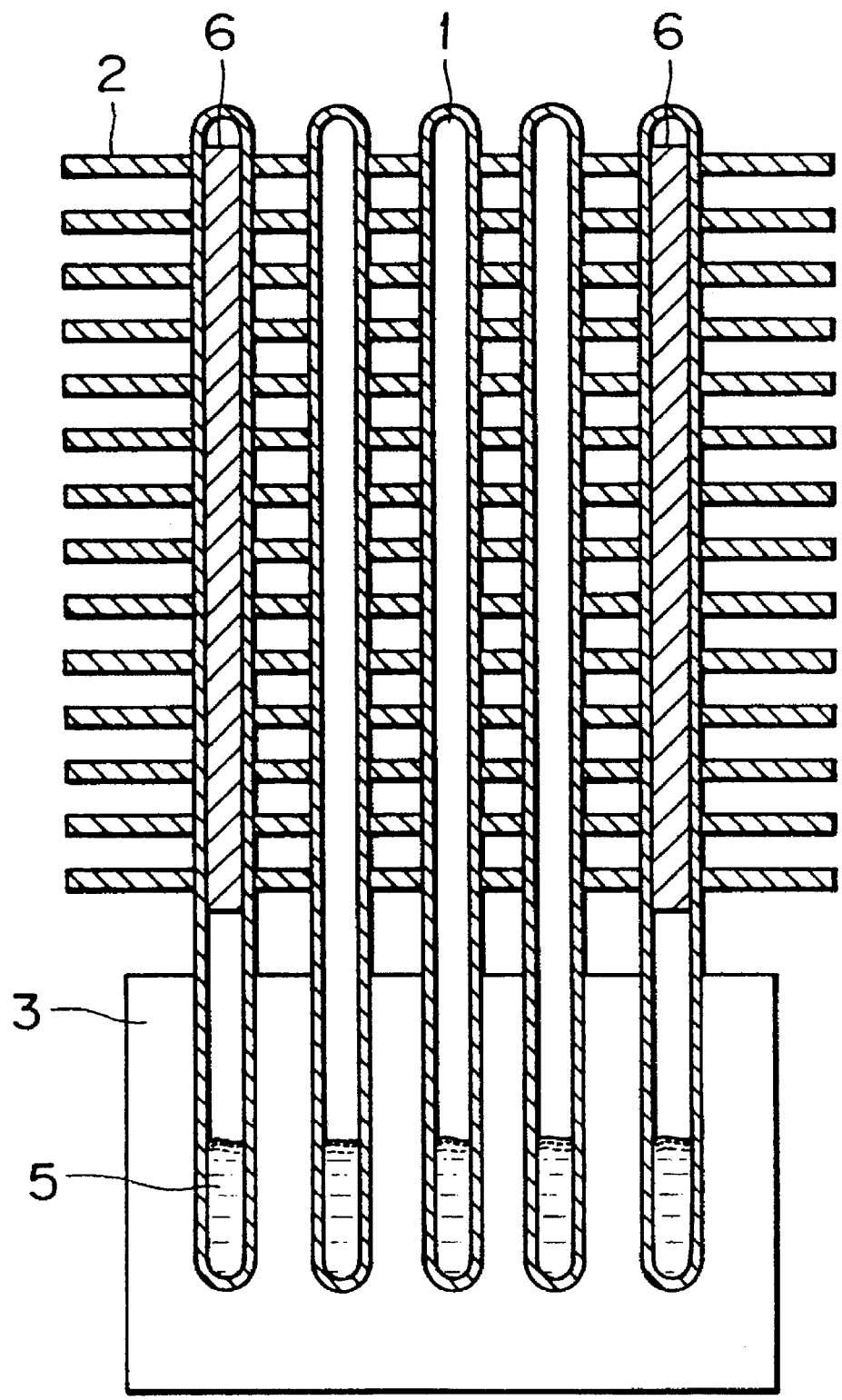
FIG. 19 is a vertical sectional view of a different embodiment of the cooling apparatus of the present invention.

The embodiment shown in FIG. 19 employs a plurality of heat pipes to which are commonly secured heat radiation fins 2. The inner surfaces of the condensation sections of the two outer heat pipes are coated with a water-repelling agent as at 6. According to this arrangement, the heat pipes having the coating 6 exhibits a smaller condensation capacity than the other heat pipes which are devoid of the coating. In this embodiment, teflon or the like material can be used as the water-repelling agent. A similar effect can be achieved by using different materials for different heat pipes. For instance, a combination of heat pipes made of copper and heat pipes made of aluminum provides the same effect as that produced by the embodiment shown in FIG. 19.

Figure 20:
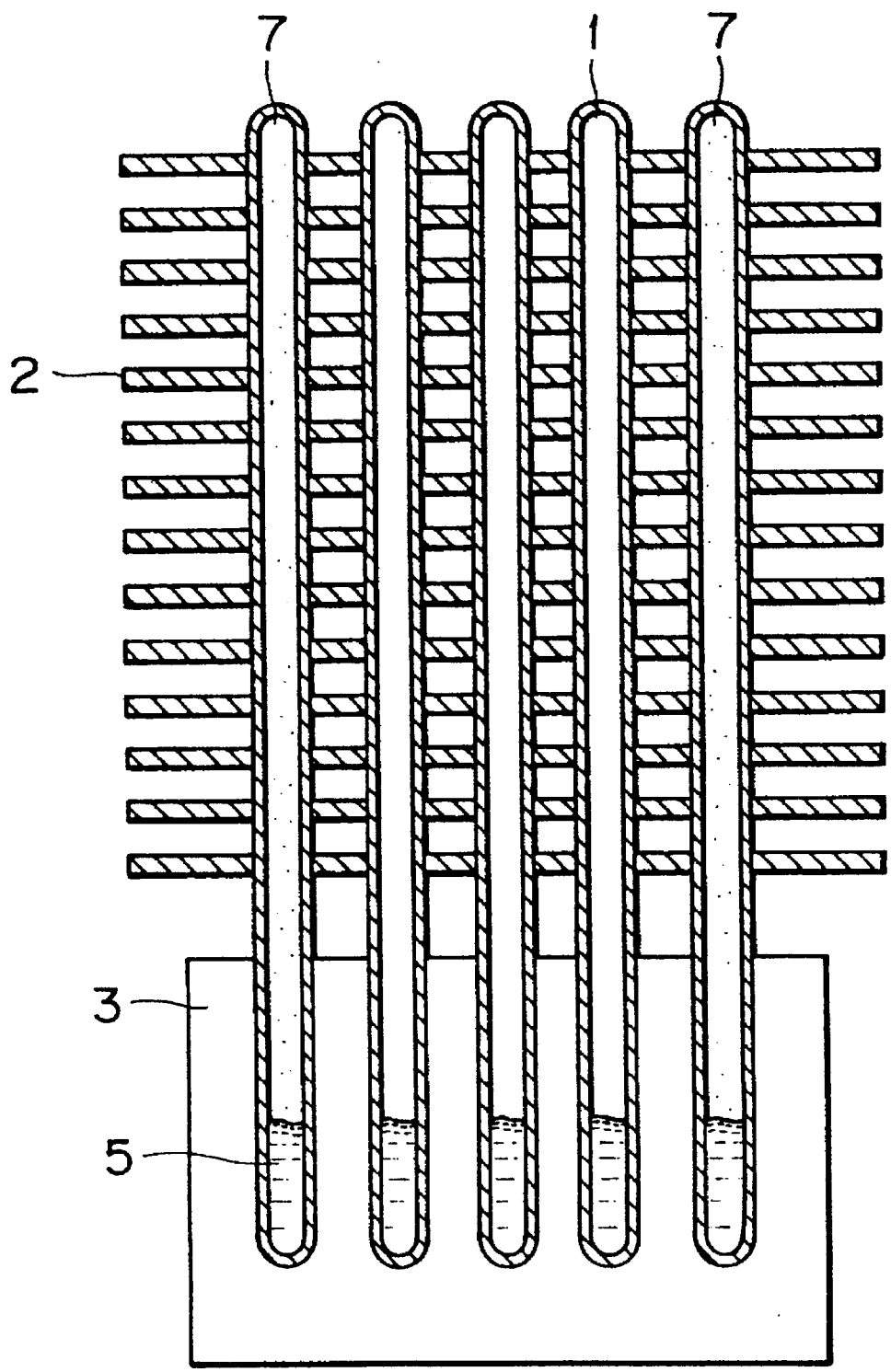
FIG. 20 is a vertical sectional view of a different embodiment of the cooling apparatus of the present invention.

The embodiment shown in FIG. 20 employs heat pipes of the same length to which are commonly secured heat radiation fins 2. Two heat pipes which are located at both outer ends of the group of heat pipes are charged with an incondensible gas 7. The incondensible gas occupies a certain part of the internal volume of the heat pipe 1, so that the heat pipe charged with this gas exhibits a smaller condensation capacity and a smaller heat dissipation capacity than the heat pipes which do not contain the gas. The volume occupied by the incondensible gas becomes greater when the ambient air temperature is low. Conversely, when the ambient air temperature is high, the volume of the incondensible gas occupied by the incondensible gas becomes smaller. Thus, the embodiment shown in FIG. 20 offers an advantage in that, when the apparatus is started while the ambient air temperature is so low as to allow the working fluid to freeze, the condensation capacity and the heat dissipation capacity of the heat pipe charged with the incondensible gas is maintained low to avoid the risk of freezing, and the performance of this heat pipe progressively approaches that of the heat pipe free of the incondensible gas as the ambient air temperature rises. The incondensible gas may be, for example, nitrogen or air.

Figure 21:
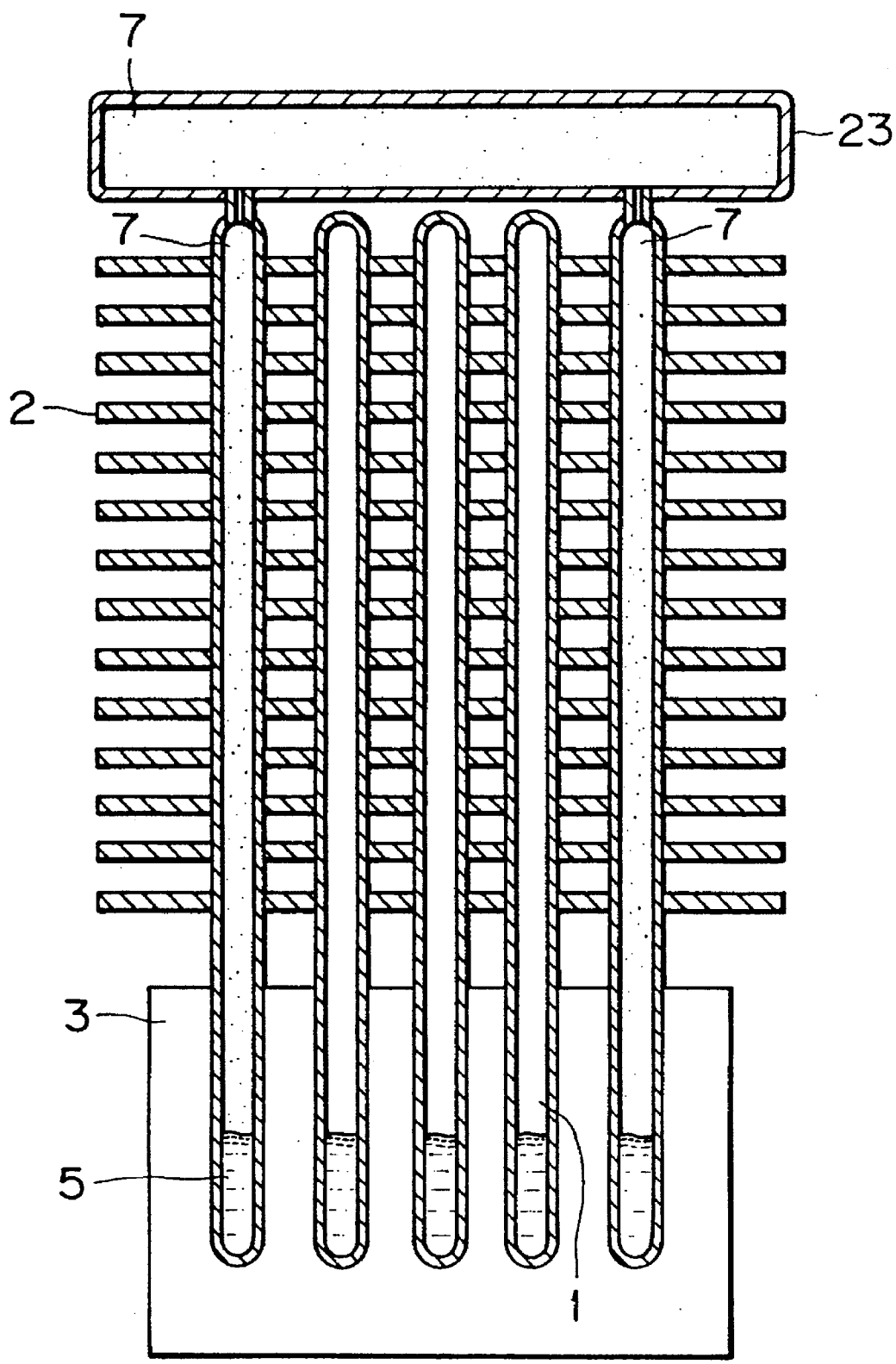
FIG. 21 is a vertical sectional view of a different embodiment of the cooling apparatus of the present invention.

The embodiment shown in FIG. 21 is basically the same as that shown in FIG. 20 except that a reservoir is connected to the ends of the heat pipes 1 which are charged with the incondensible gas. Obviously, the reservoir may be substituted by bellows or the like.

Figure 22:
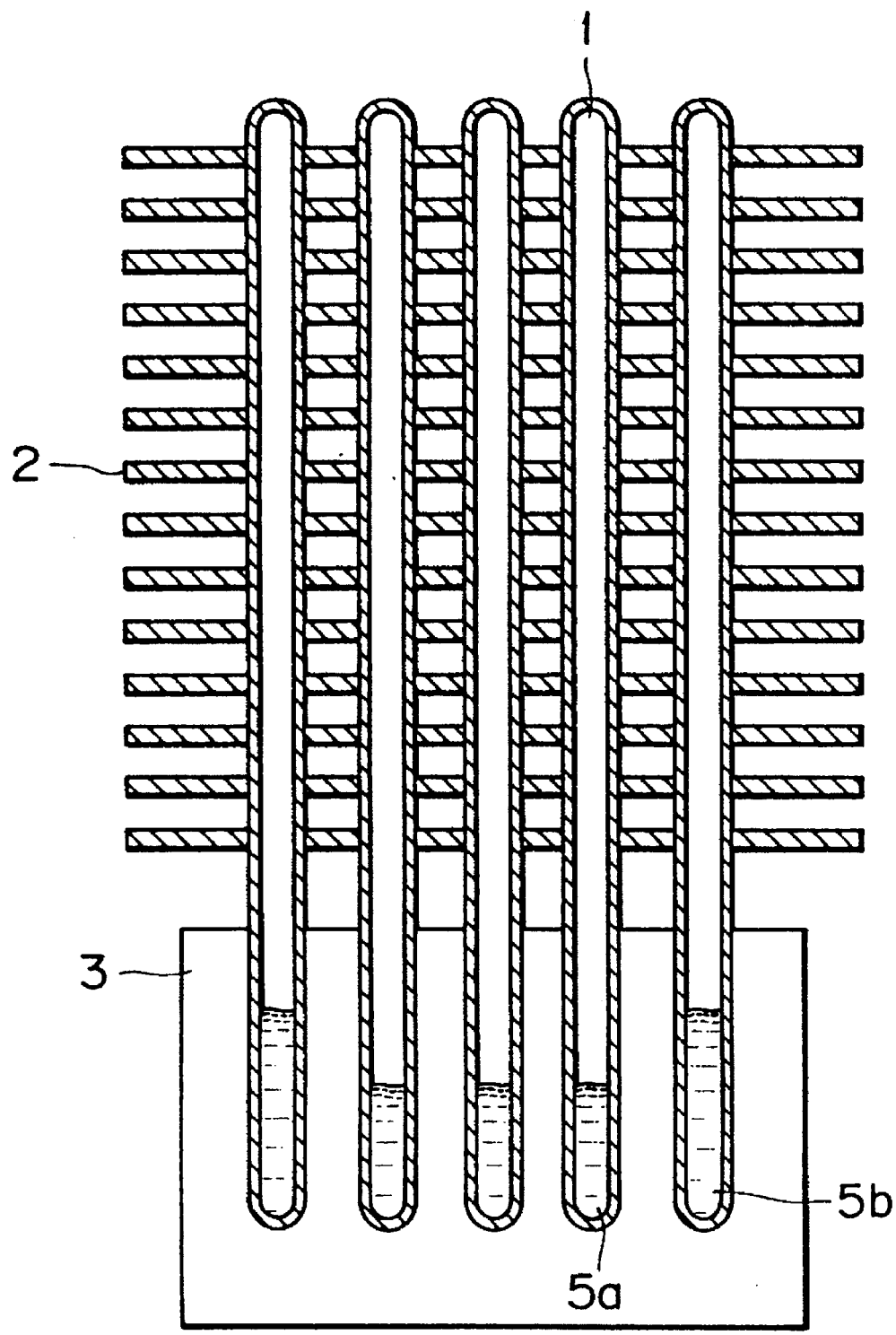
FIG. 22 is a vertical sectional view of a different embodiment of the cooling apparatus of the present invention.

A different embodiment of the cooling apparatus of the present invention will be described with reference to FIG. 22 which is a vertical sectional view of this embodiment. This embodiment employs a plurality of heat pipes of the same length, and heat radiation fins 2 of a substantially equal area commonly attached to all the heat pipes 1. The heat pipes arranged at both outer ends of the group of the heat pipes are charged with a greater quantity of the working fluid 5 than the inner three heat pipes which are arranged in the central part of the group of the heat pipes. In operation, the working liquid in each of two outer heat pipes is raised by the voids of the fluid generated as a result of the boiling to a level higher than that in the central three heat pipes, so that the effective heat transfer area of the condensation section is made smaller and, hence, the condensation capacity and the heat dissipation capacity are smaller for the heat pipe containing the greater quantity of the working fluid than for the heat pipes containing smaller quantity of working fluids.

A description will now be given of different cooling apparatuses embodying the present invention with reference to FIGS. 23 and 24 which are vertical sectional views of the embodiment.

Figure 23:
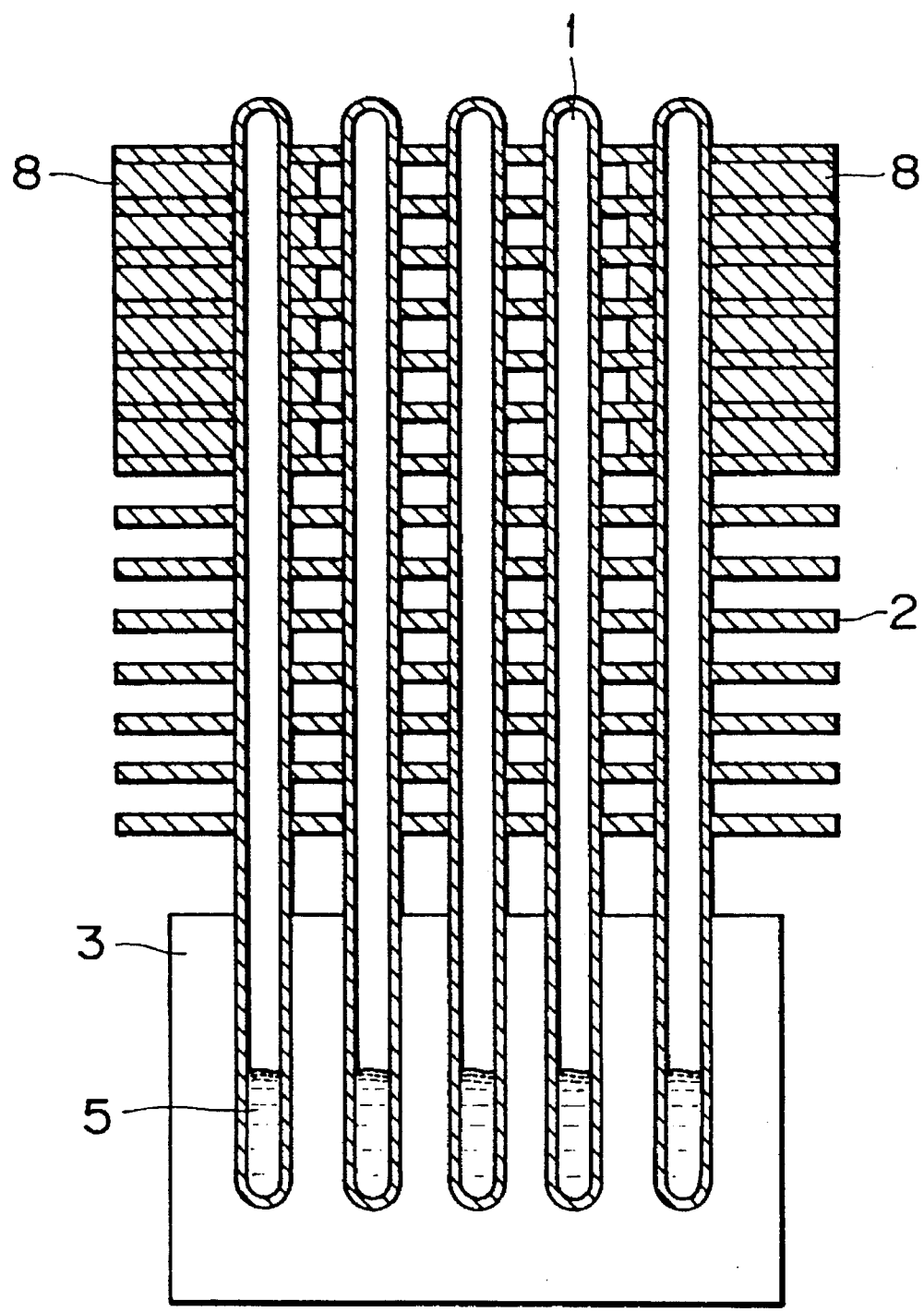
FIG. 23 is a vertical sectional view of a different embodiment of the cooling apparatus of the present invention.

As will be seen from FIG. 23, heat radiation fins 2 of almost the same area are attached to heat pipes 1 of the same length. Introduction of air to the regions around the heat radiation fins 2 on the ends of the two outer heat pipes is impeded by spacers 8 which are disposed locally at portions of the spaces between these heat radiation fins, so as to realize a smaller heat dissipation capacity for these two outer heat pipes than other heat pipes. The spacers 8 are collectively attached to the end regions of the heat radiation fins. This arrangement permits an easy reduction of the heat dissipation capacity for the selected heat pipes.

Obviously, the spacers 8 may be substituted by other types of members such as baffle plates, capable of causing impediment to introduction of air to the regions around the heat radiation fins.

Figure 24:
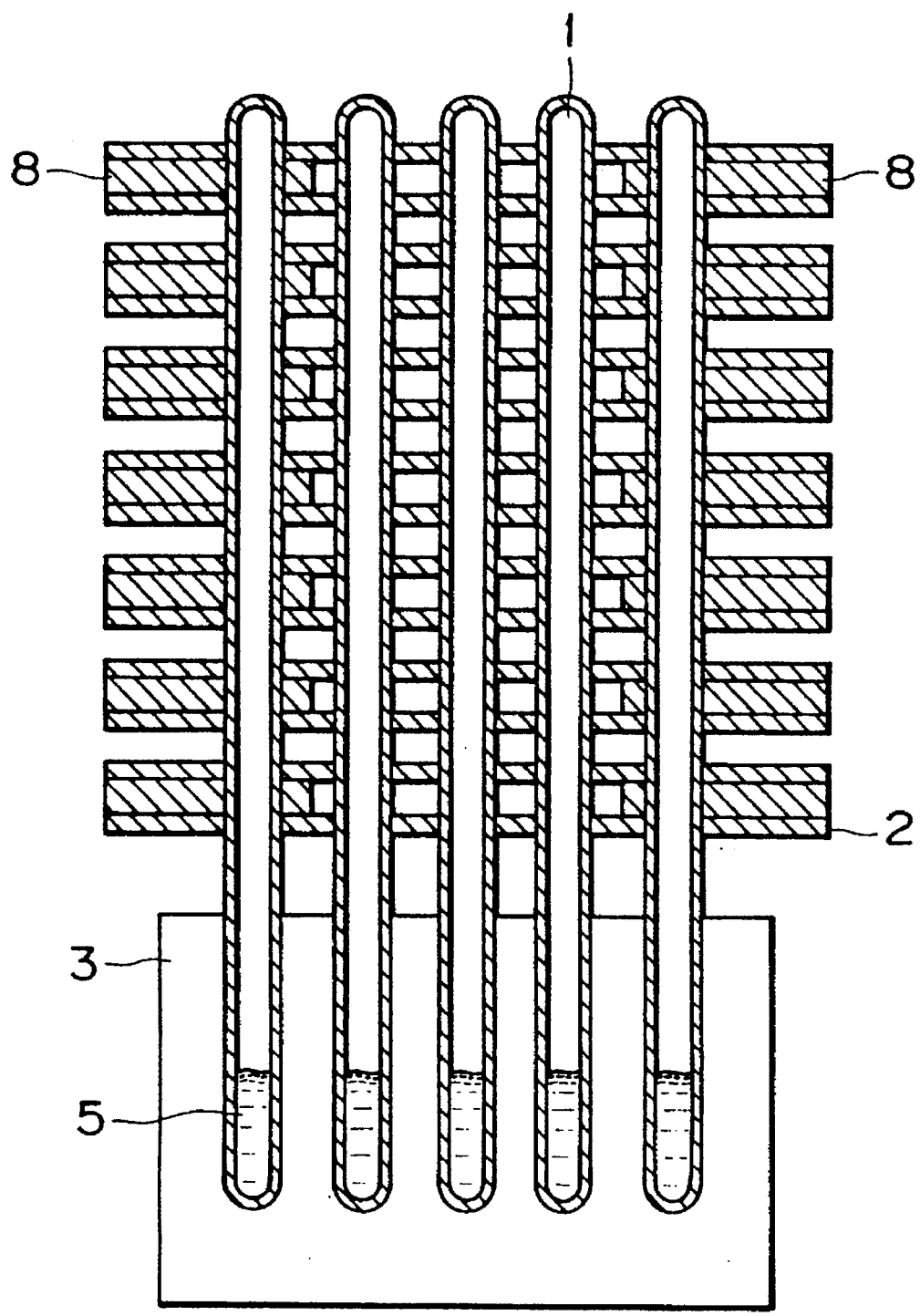
FIG. 24 is a vertical sectional view of a different embodiment of the cooling apparatus of the present invention.

The embodiment shown in FIG. 24 is basically the same as that shown in FIG. 23, except that the spacers 8 are arranged at a constant interval to the condensation sections of the heat pipes. The arrangements of the spacers 8 shown in FIGS. 23 and 24 are only illustrative and may be varied as desired.

Figure 25:
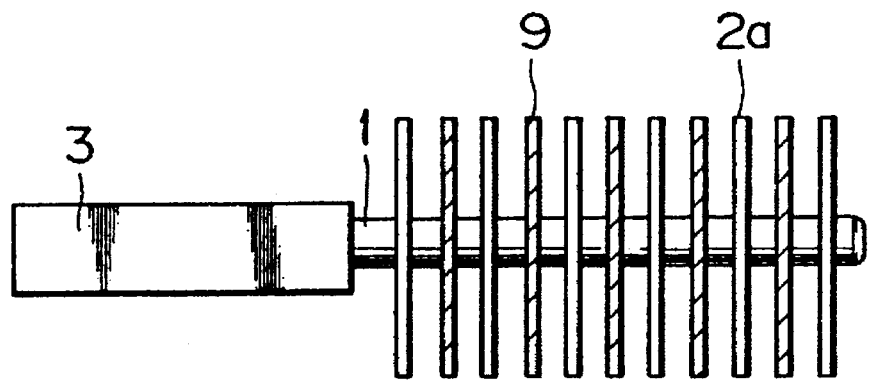
FIG. 25 is a vertical sectional view of a different embodiment of the cooling apparatus of the present invention.
Figure 26:
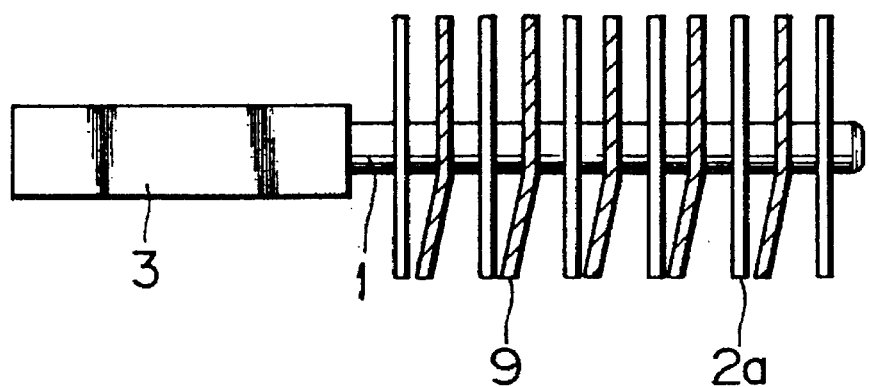
FIG. 26 is a vertical sectional view of a different embodiment of the cooling apparatus of the present invention.

A different cooling apparatus embodying the present invention will be described with reference to FIGS. 25 and 26 which are side views of the apparatus in different states as viewed in a direction parallel to the plane over which the heat pipes are arrayed.

These embodiments have a common feature in that a plurality of heat pipes are secured at one end each to the block 3, while a plurality of heat radiation fins 2a are attached to the other end of the heat pipes 1, wherein some of the heat radiation fins are made of a shape memory allow 9.

The operation of the shape memory alloy is as follows. When the ambient air temperature is normal, the heat radiation fins made of the shape memory alloy preserves the same configurations as other fins. FIG. 26 shows the state of the apparatus as observed when the ambient air temperature has come down. The fins made of the shape memory alloy changes their shape due to low temperature such that the portion of each such fin below the pipe-receiving hole is deflected towards the adjacent fin, thus causing impediment to the introduction of air into the space between these fins. Consequently, the heat dissipation capacity is decreased. In this embodiment, therefore, the heat dissipation from the heat pipes is reduced when the ambient air temperature is low, without impairing the performance at normal ambient air temperature.

Figure 27:
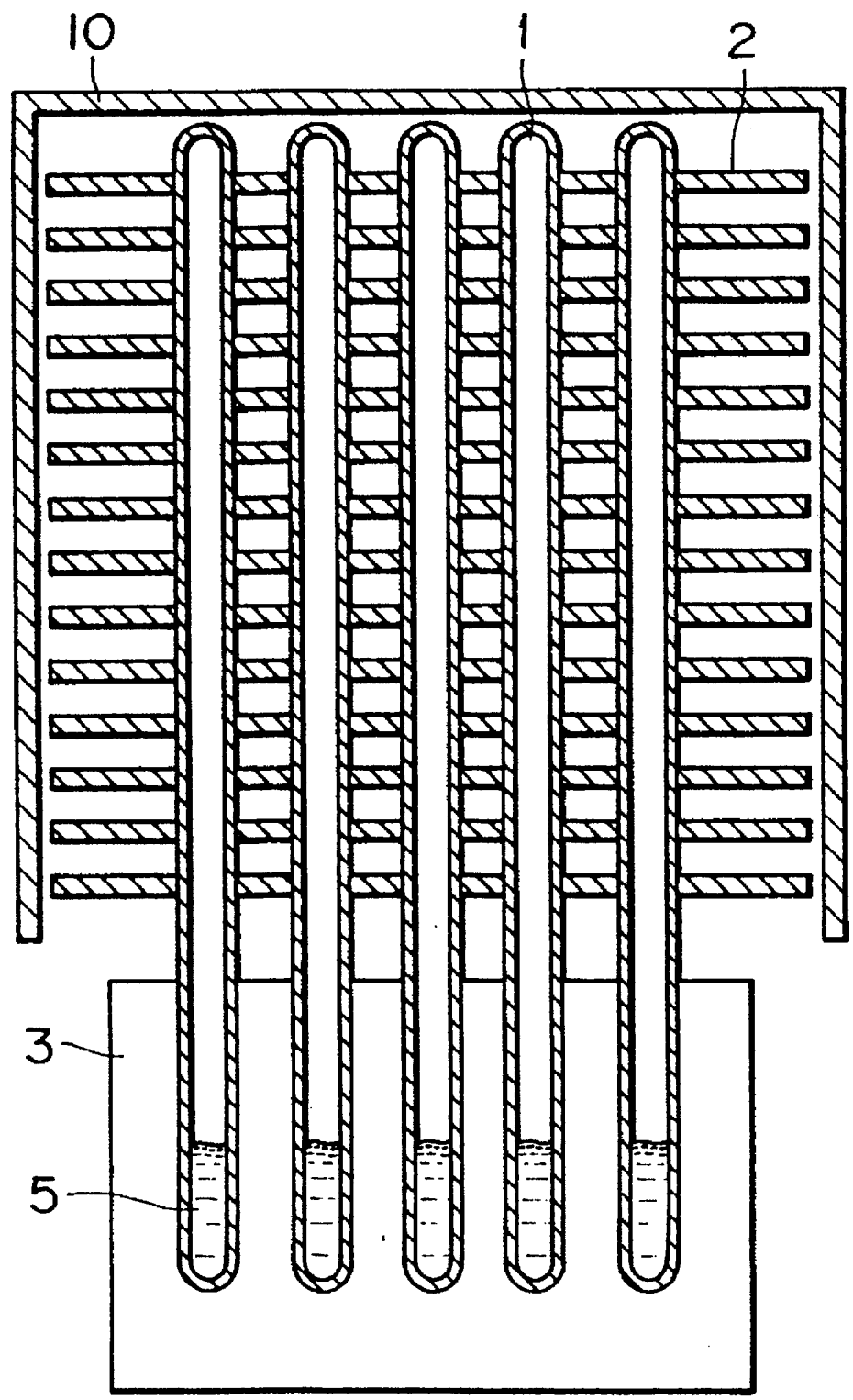
FIG. 27 is a vertical sectional view of a different embodiment of the cooling apparatus of the present invention.

A different embodiment of the cooling apparatus in accordance with the present invention will be described with reference to FIG. 27 which is a side elevational view of the cooling apparatus. As will be seen from this figure, the cooling apparatus of this embodiment employs a plurality of heat pipes 1 which are received each at one end in a hole formed in a block 3. A plurality of heat radiation fins 2 are secured to the other ends of the heat pipes 1. The heat radiation fins 2 are surrounded by a removable cover 10. When the ambient air temperature is low, the cover 10 is set to surround the heat radiation fins 2 so as to interrupt the air coming into contact with the heat radiation fins 2 or to reduce the rate of introduction. Conversely, when the ambient air temperature is not so low, the cover 10 is detached to allow the air to flow into contact with the heat radiation fins, thereby enhancing the heat dissipation capacity. Obviously, the removable cover 10 may be substituted by a fixed cover integrated with the heat-pipe type cooling apparatus and provided with a mechanism for controlling the flow of air into the spaces between the heat radiation fins, e.g., shutters, baffle plates or the like.

A cooling apparatus of a different embodiment will now be described with reference to FIG. 28 which is a side elevational view of a housing to which the cooling apparatus is attached.

Figure 28:
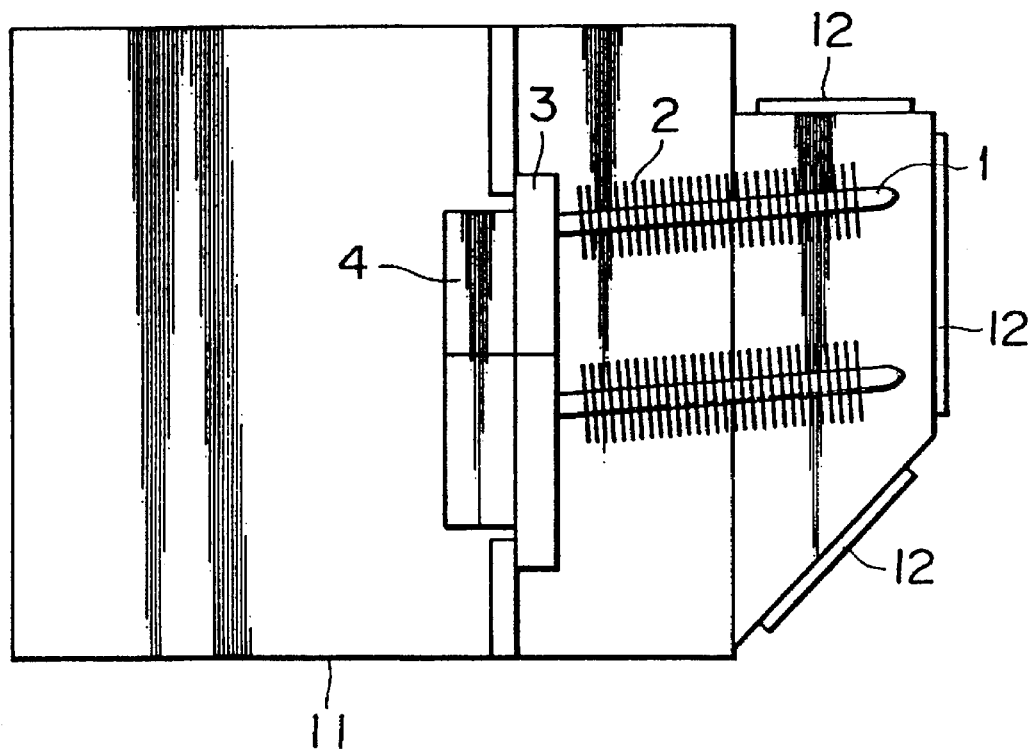
FIG. 28 is a sectional view of a housing loaded with a cooling apparatus embodying the present invention.

More specifically, FIG. 28 shows the housing, denoted by 11, which may be a housing which houses a control apparatus suspended from chassis of a railroad vehicle, together with part of the control apparatus. One end of each of a plurality of heat pipes are attached to the block 3. A plurality of heat dissipation fins 2 are secured to the heat pipes. Furthermore, the heat pipes 1 are bent such that the heat radiation fins extend substantially perpendicularly to the ground surface. Two units of such cooling apparatuses are used: one above the other, so as to cool a pair of semiconductor devices 4. The portion of the housing 1 surrounding the heat radiation fins 2 are provided with a multiplicity of apertures or is formed of a gauze-wire plate to promote ventilation of the space inside the housing 11. A shutter mechanism is used to open and close the apertures or the mesh of the gauze wire. When the ambient air temperature is low, e.g., in winter, the shutter is closed so as to reduce the heat dissipation capacity of the heat pipe. As in the cases of other embodiment described before in connection with FIG. 27, the mechanism for controlling the flow of air into and out of the region around the heat radiation fins is not limited to a shutter.

Figure 29:
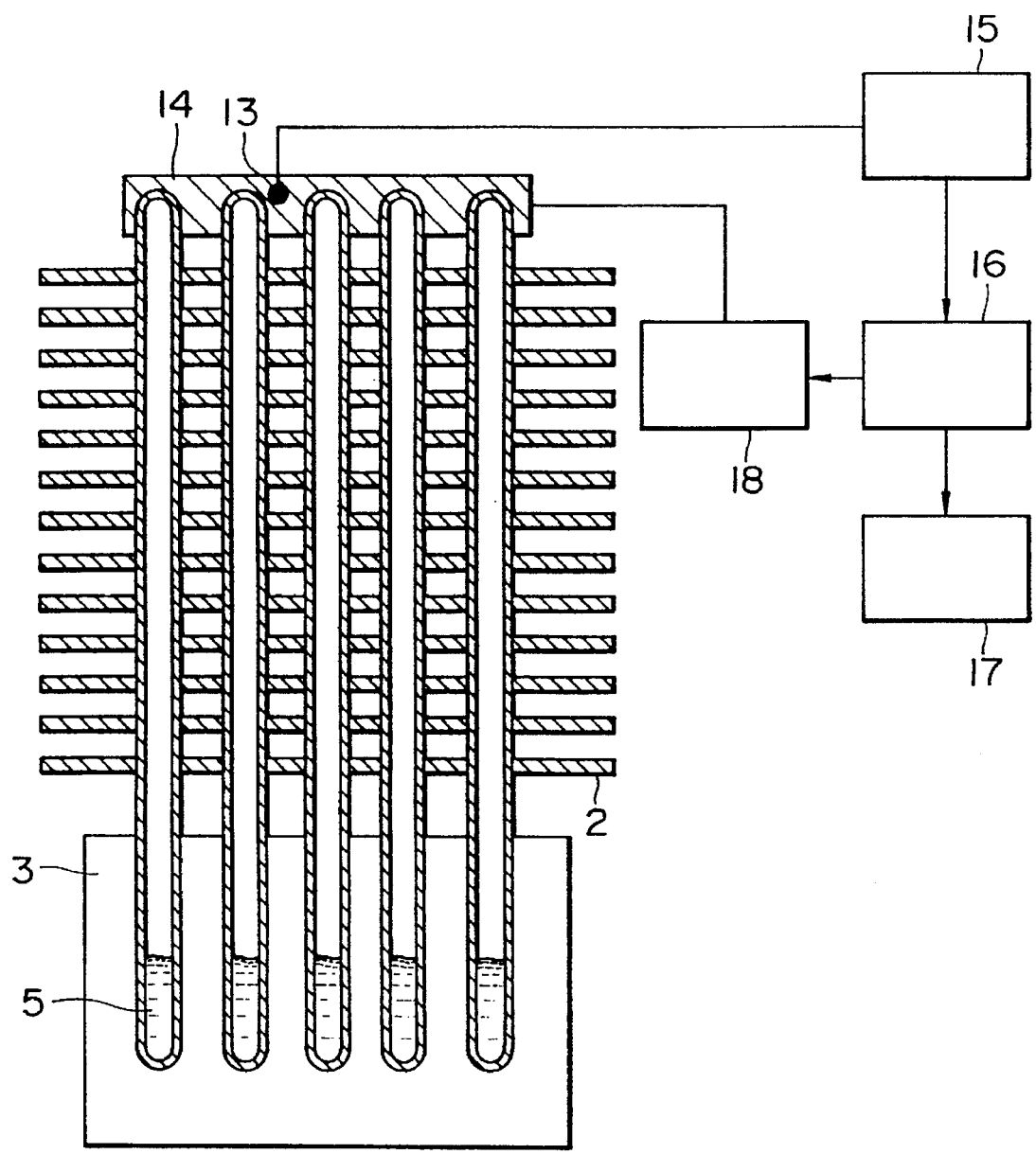
FIG. 29 is a vertical sectional view of a different embodiment of the cooling apparatus in accordance with the present invention.

Different cooling apparatuses of the present invention will be described with reference to FIGS. 29 and 30 which are vertical sectional views of these cooling apparatuses. Referring first to FIG. 29, each of a plurality of heat pipes is fixed at its one end to the block 3. A plurality of heat radiation fins 2 are secured to the condensation sections of the heat pipes 1. A heat generating member 14 and a heat sensing element 13 are attached to the end extremities of the heat pipes. The temperature of the heat pipes sensed by the temperature sensor 13 is input to a comparator 16 via an amplifier 15, so as to be compared with the temperature which has been set in a temperature setting device 17. When the sensed temperature of the end extremities of the heat pipes is lower than the set temperature, the heat generating member is supplied with electrical power corresponding to the temperature difference, from a driver circuit 18. By determining the set temperature to be equal to the temperature at which freezing of the working medium takes place, it is possible to avoid freezing of the working fluid inside the heat pipe.

Figure 30:
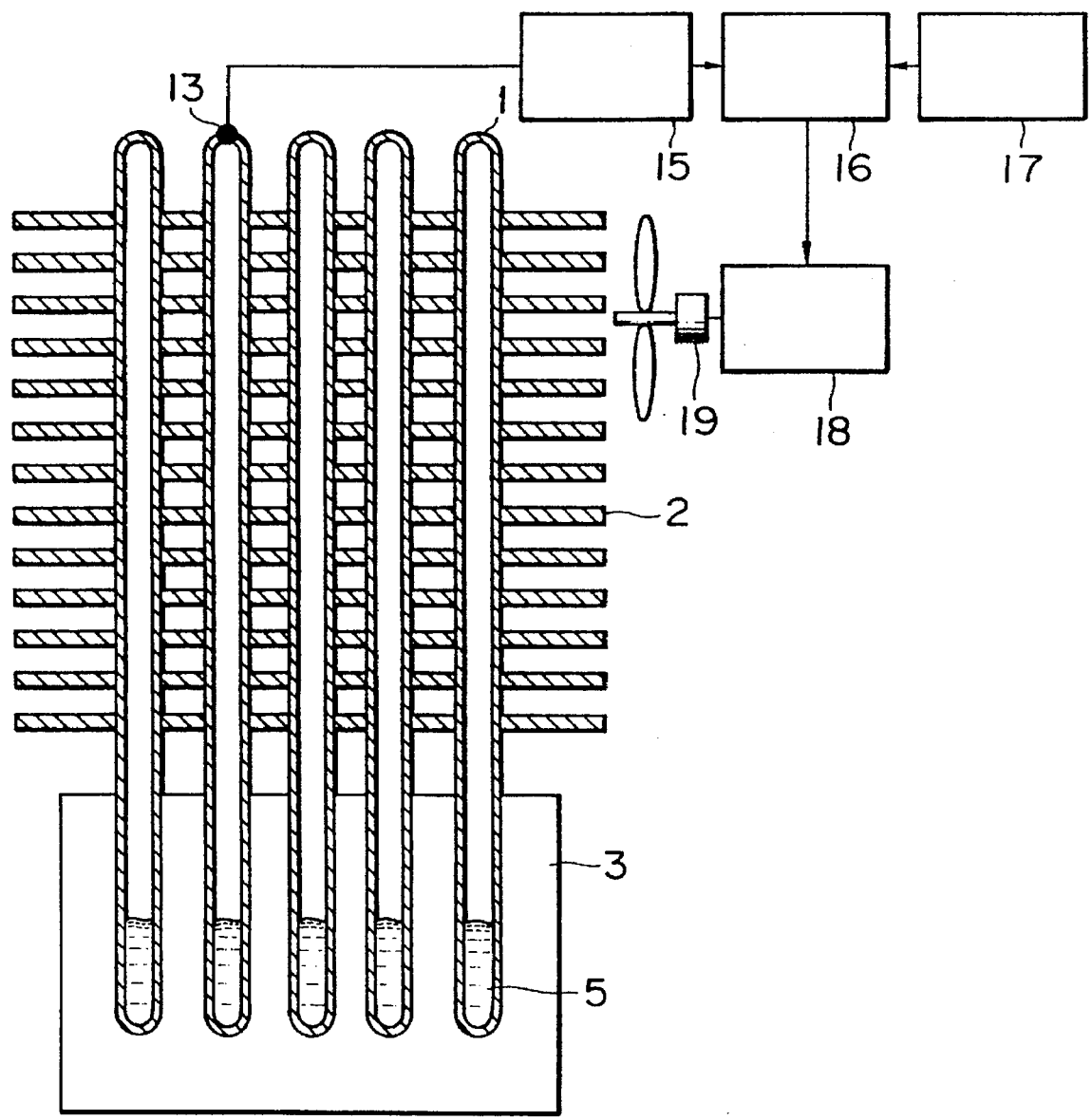
FIG. 30 is a vertical sectional view of a different embodiment of the cooling apparatus in accordance with the present invention.

Referring now to FIG. 30, each of a plurality of heat pipes is secured at its one end to the block 3, and a plurality of heat radiation fins 2 are attached to these heat pipes. A cooling blower 19 is disposed in the vicinity of the heat radiation fins so as to force cooling air into the spaces between the fins, thereby effecting forced cooling. A temperature sensing element 13 attached to the end extremity of the heat pipe senses the temperature of this end extremity. A signal corresponding to the sensed temperature is supplied to a comparator 16 through an amplifier 15, so as to be compared with a temperature set in the temperature setting device 17. A driver circuit 18 operates in accordance with the difference between the sensed temperature and the set temperature so as to drive the blower 19, thereby performing the speed control of the blower. It is possible to selectively reduce the heat dissipation capacity of the heat pipe by arranging such that the blower does not operate or operates at a low speed when the temperature of the ambient air is lower than a predetermined level.

Figure 31:
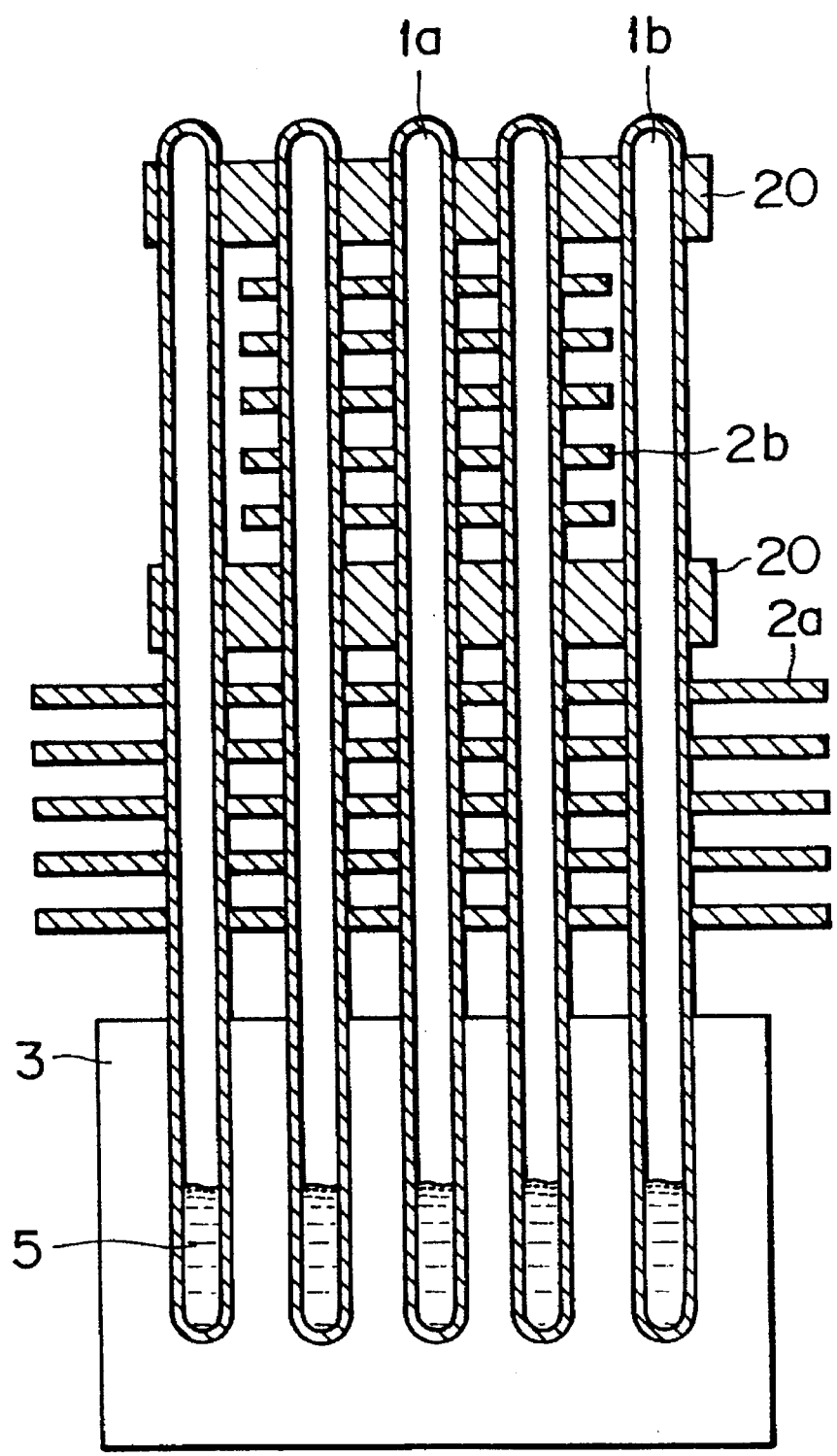
FIG. 31 is a vertical sectional view of a different embodiment of the cooling apparatus of the present invention.

A different embodiment of the cooling apparatus of the present invention will be described with reference to FIG. 31 which is a vertical sectional view of the cooling apparatus.

This embodiment is basically the same as the embodiment described before in connection with FIG. 1. In this embodiment, copper blocks 20 of thicknesses greater than that of the fins are secured to the end extremities and to the middle part of the heat pipes. According to this arrangement, the heat transportation between the heat pipes is promoted so as to lower the temperature at which the heat pipe having greater heat dissipation capacity is restarted after freezing of the working fluid therein.

A description will now be given of the operation of this embodiment shown in FIG. 31, with reference to FIGS. 32 and 33.

Figure 32:
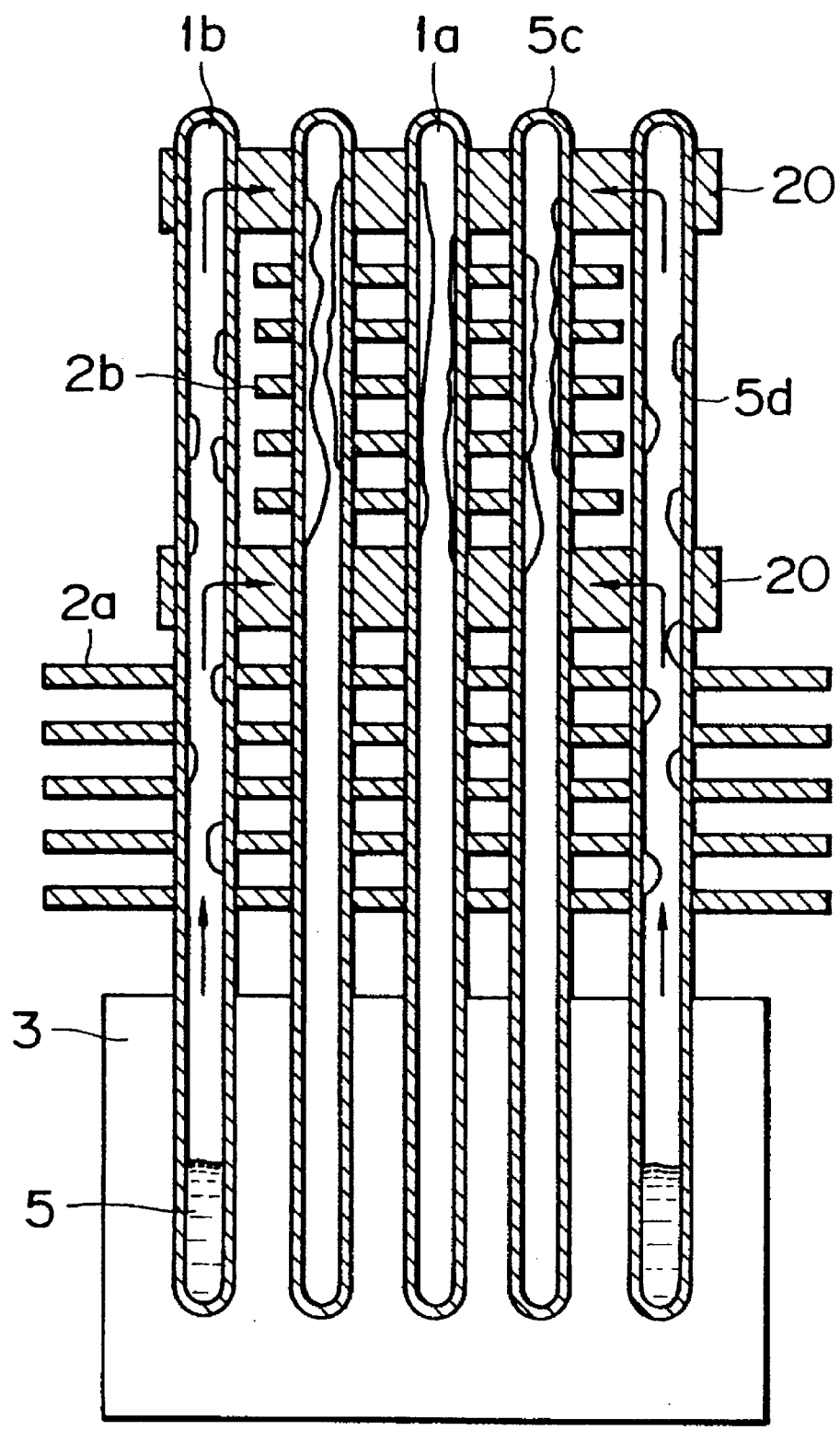
FIG. 32 is a vertical sectional view of a heat-pipe type cooling apparatus of the present invention, showing also the behavior of a working fluid inside the heat pipes of the cooling apparatus.

FIG. 32 illustrates the behavior of the working fluid, as well as the state of transportation of heat, as observed when the apparatus operates with water as the working fluid at a very low ambient air temperature of –30° C. In this state, the central three heat pipes 1a having greater heat dissipation capacity cannot operate, as the working fluid 5c is frozen inside the condensation section. Meanwhile, two heat pipes arranged at both lateral or outer ends of the group of the heat pipes, having smaller heat dissipation capacity, are operating in normal state. In this case, the temperature of the condensation section of the heat pipes 1a is lower than the temperature of the condensation section of the heat pipes 1b. In this case, heat is conducted to the central three heat pipes 1a from the outer heat pipes 1b through the copper block 20, so that the temperature of the condensation section of the central three heat pipes has been elevated to a level higher than the ambient air temperature, although the heat pipes 1a are not operating.

Figure 33:
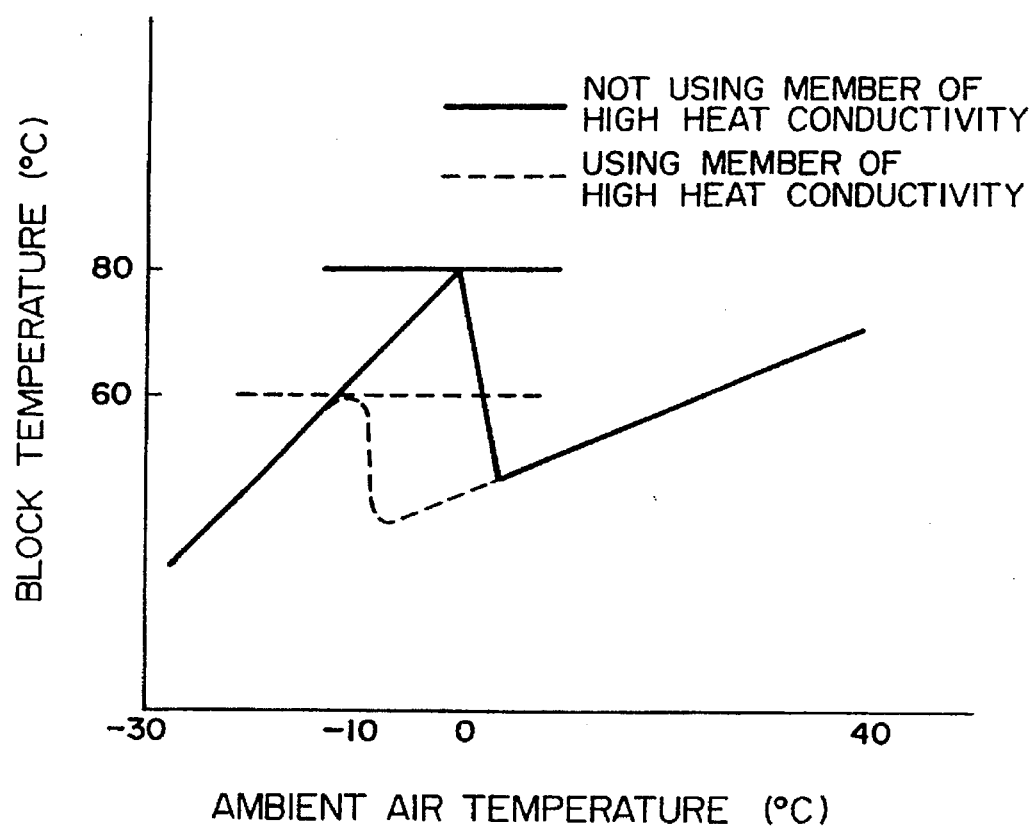
FIG. 33 is a graph showing a transient characteristics of the heat-pipe type cooling apparatus of the present invention.

FIG. 33 illustrates the manner in which the temperature of the block 3 rises when the ambient air temperature is raised from –30° C. A solid-line curve shows the temperature of the block 3 as observed in the apparatus which is devoid of the copper block 20, while the broken-line curve shows the temperature as observed when the copper block 20 is used. When no copper block 20 is used, the working fluid in the heat pipe 1a is frozen to cause a shortage of the liquid phase of the working fluid in this heat pipe 1a. Thus, the central three heat pipes 1a do not make any contribution to the transportation of heat. As a result, the temperature of the condensation section is held at a temperature almost the same as the ambient air temperature.

In order that the heat pipes 1a are restarted, it is necessary that the ambient air temperature rises to about 0° C. The solid-line curve in FIG. 33 shows that the temperature of the block portion is temporarily lowered due to start of operation of the central heat pipes 1a when the ambient air temperature has reached 0° C., and then starts to rise again in accordance with the rise of the ambient air temperature. From FIG. 33, it will be seen that the temperature at the block portion well reaches 80° C. or so, when the ambient air temperature is around 0° C. On the other hand, when the copper block 20 is used, the temperature of the condensation sections of the central three heat pipes having the greater heat dissipation capacity has been raised to a level above the ambient air temperature, for the reasons stated above in connection with FIG. 32. It is assumed here that the temperature of the condensation sections of the central three heat pipes 1a has been raised to a level 10° C. higher than the ambient air temperature due to the effect of the copper block 20. This means that, when the ambient air temperature is still as low as −10° C., the temperature of the condensation sections of the central three heat pipes 1a has been raised to 0° C. or so, so that these heat pipes are restarted. The broken-line curve in FIG. 33 indicates that, when the ambient air temperature has reached −10° C. or so, the central three heat pipes 1a start to operate to temporarily lower the temperature of the block portion and, thereafter, the temperature of the block portion rises in accordance with the rise of the ambient air temperature. FIG. 33 illustrates that the temperature of the block portion reaches about 60° C. when the ambient air temperature is −10° C. Thus, by using copper blocks 20, it is possible to lower the maximum temperature of the block portion when the ambient air temperature is below 0° C. In some cases, such lowering of the maximum temperature can be achieved over the entire range of temperature at which the apparatus is used.

Figure 34:
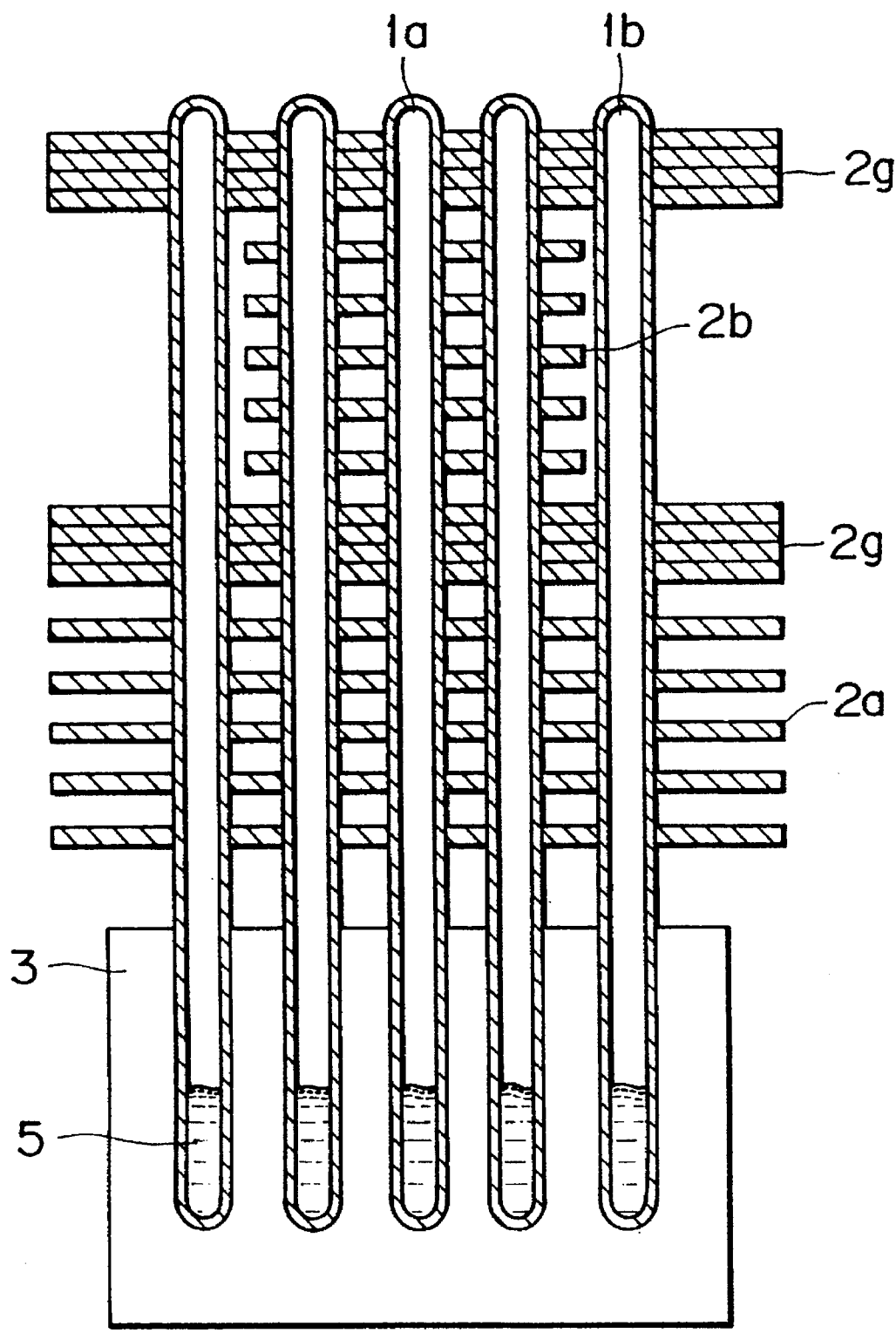
FIG. 34 is a vertical sectional view of a different embodiment of the cooling apparatus of the present invention.

A different cooling apparatus embodying the present invention will be described with reference to FIG. 34 which is a vertical sectional view of the cooling apparatus. In this embodiment, the copper blocks 20 used in the embodiment shown in FIG. 31 are replaced with stacks 2g of the heat radiation fins, each stack including a plurality of heat radiation fins which are sized to span all the heat pipes and which are densely stacked without leaving any gap between adjacent fins. According to this arrangement, the surfaces of the fins of each stack 2g are concealed and kept away from the air, so that the stack 2g serves to promote the transportation of heat between the heat pipes. This embodiment makes it possible to promote heat conduction between the heat pipes without preparing or using any specific member such as the copper blocks, since the stack of the heat radiation fins can easily be formed from the heat radiation fins. Practically, a member having large heat conductivity may be used as the member for mounting the cooling apparatus, on the ends of the heat pipes constituting the cooling apparatus.

A different cooling apparatus embodying the present invention will be described with reference to FIG. 35 which illustrates application of the cooling apparatus to a railroad vehicle. More specifically, FIG. 35 schematically shows the portion of the railroad vehicle from which a vehicle control apparatus is suspended.

Figure 35:
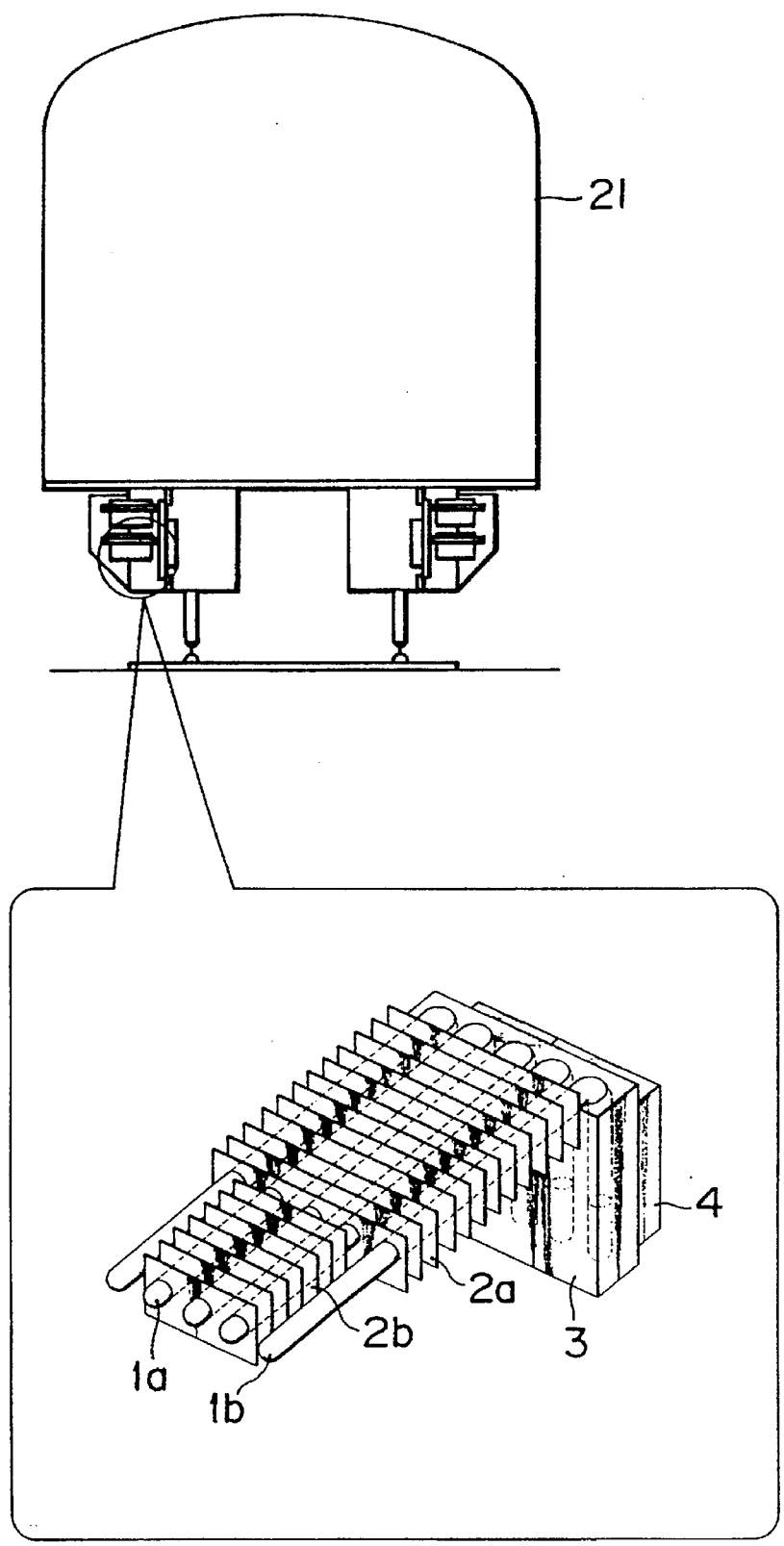
FIG. 35 is a front elevational view of an embodiment of the present invention applied to an actual product.
Figure 36:
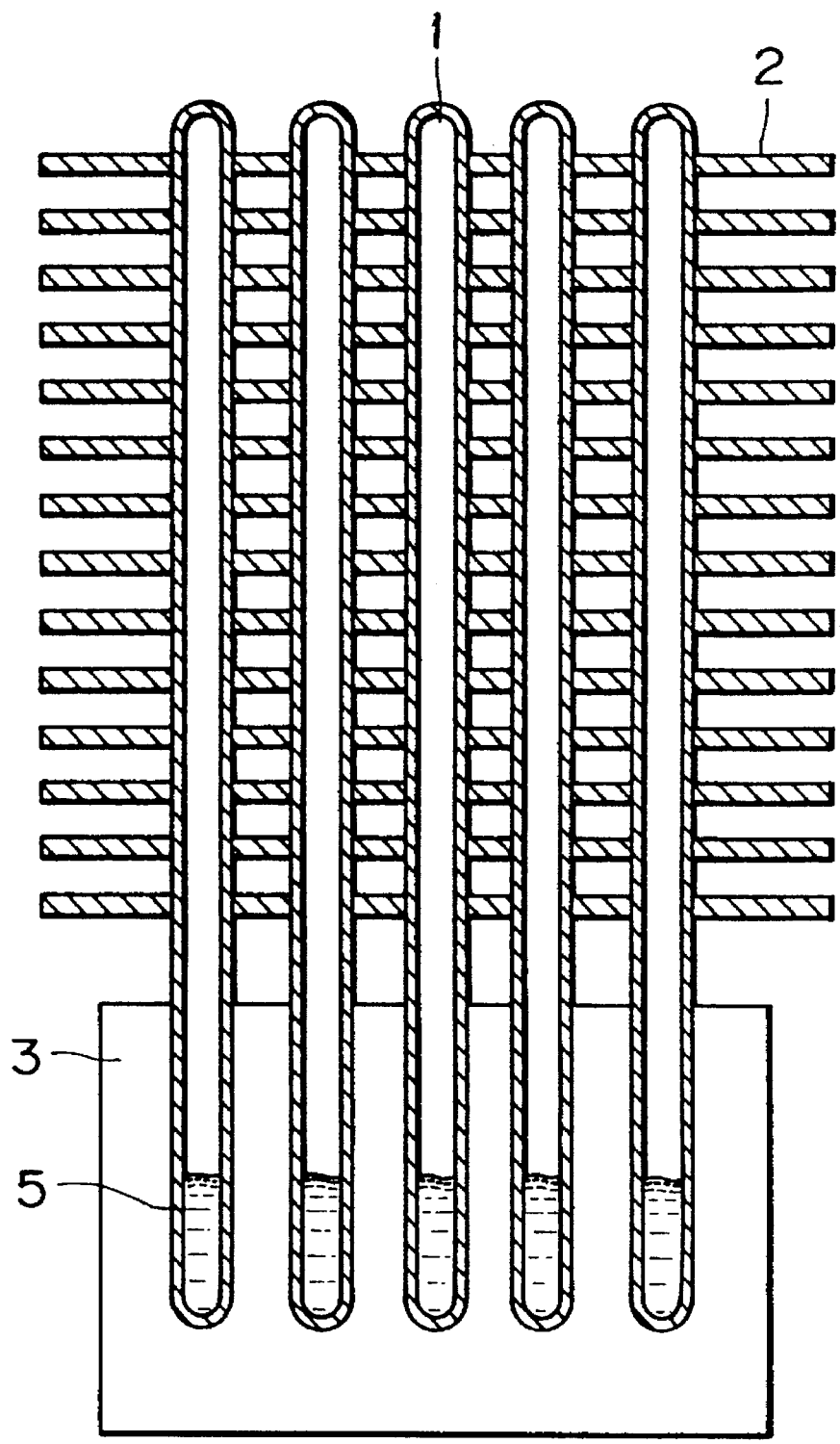
FIG. 36 is a vertical sectional view of a conventional heat-pipe type cooling apparatus.

Referring to FIG. 35, the cooling apparatus is disposed under the floor of the railroad vehicle chassis 21, in order to cool semiconductor devices which are the major components of a control circuit for controlling the propulsion motor of the vehicle. The cooling apparatus is a heat-pipe type cooling apparatus which embodies the present invention, as illustrated in a grater scale at lower part of FIG. 35. As will be understood from this figure, the semiconductor devices to be cooled are assumed to be devices of planar packaged type, e.g., IGBT modules. When the semiconductor devices to be cooled are of laminate type such as GTO thyristors, the semiconductor devices and the blocks of the cooling apparatus are alternately stacked in layers.

The cooling apparatus of the present invention may be applied not only to the control devices for railroad vehicles but also to cooling of a variety of types of semiconductor devices which are expected to be used at low ambient air temperatures, e.g., in cold districts. For instance, the cooling apparatus of the invention can suitably be employed for the purpose of cooling a general-purpose inverter for controlling an A.C. motor used in a cold district, or for the purpose of cooling an optical transmission system for communication in a cold district.

Although the invention has been described through its specific forms, it is to be understood that the described embodiments are only illustrative and various changes and modifications may be imparted thereto. For instance, although each embodiment has been described to have five heat pipes constituting the cooling apparatus, the cooling apparatus of the present invention may employ any desired number of heat pipes. It is also possible to use three or more types of heat radiation fins in each embodiment, although the embodiment described employs one or two types of heat radiation fins.

As will be understood from the foregoing description, the present invention provides a heat-pipe type cooling apparatus having plurality of heat pipes, which can effectively perform cooling operation even under environment where the ambient air temperature is lower than the freezing temperature of the working fluid, as well as high heat transportation capacity during operation at normal temperature, thus offering effective means for cooling semiconductor devices, IGBT module, GTO thyristor and so forth.

What is claimed is:

1. A heat-pipe type cooling apparatus comprising: a plurality of heat pipes; a block which is made of a material having high heat conductivity and to which an object to be cooled is attached; each of said heat pipes having one end embedded in said block and containing a working fluid capable of freezing at cold ambient temperature conditions; and portions of said heat pipes exposed from said block being provided with heat radiation fins as heat dissipators so as to constitute condensation sections of said heat pipes, wherein the improvement comprises said heat pipes with said heat dissipators being grouped into at least two groups such that the heat pipes of the at least two groups have different heat dissipation abilities and heat dissipation in at least one of said groups is sufficiently low to prevent freezing of the working fluid at the cold ambient temperature conditions.

2. A heat-pipe type cooling apparatus according to claim 1, wherein said groups of heat pipes have different total areas of said heat radiation fins associated therewith.

3. A heat-pipe type cooling apparatus according to claim 1, wherein said heat pipes of said groups have different lengths.

4. A heat-pipe type cooling apparatus according to claim 2, wherein there are two types of said heat radiation fins, each said fin having holes penetrated by said heat pipes and sized to span all said heat pipes, and wherein, in said fin of one of said two types, said holes corresponding to selected heat pipes are enlarged to have inside diameter greater than the outside diameter of said heat pipe.

5. A heat-pipe type cooling apparatus according to claim 1, wherein said heat radiation fins are sized to span all of said heat pipes, and wherein spacers are provided at the radially outer region of said fins so as to impede flow of air into the spaces between said fins.

6. A heat-pipe type cooling apparatus according to claim 2, wherein said heat radiation fins are independently attached to each of said heat pipes, and wherein the heat pipes of different groups have different numbers of heat radiation fins attached thereto, so that the heat pipes of different groups have different heat dissipation capacities.

7. A heat-pipe type cooling apparatus according to claim 1, wherein said heat radiation fins are independently attached to each of said heat pipes, and wherein said heat radiation fins attached to heat pipes of different groups are made of different materials.

8. A heat-pipe type cooling apparatus according to claim 1, wherein the heat pipes of different groups have different inner surface configurations.

9. A heat-pipe type cooling apparatus according to claim 8, wherein said heat pipes are grouped into first and second groups, each of said heat pipes of said first group has the inner surface provided with grooves extending in the longitudinal direction, and each of the heat pipes of said second group has a smooth inner surface.

10. A heat-pipe type cooling apparatus according to claim 1, wherein a coating of a water-repelling material is formed on the inner surfaces of condensation sections of the heat pipes of one of the groups of heat pipes.

11. A heat-pipe type cooling apparatus according to claim 1, wherein said heat radiation fins are grouped into at least two groups, and the heat radiation fins of different groups are made of different materials one of which is a shape memory alloy.

12. A heat-pipe type cooling apparatus according to claim 2, further comprising at least one member disposed between two adjacent heat radiation fins, said member having a greater cross-section taken along the length of said heat pipes than said heat radiation fins and has a high heat conductivity so as to promote transportation of heat between different heat pipes.

13. A heat-pipe type cooling apparatus according to claim 12, wherein said member having high heat conductivity is a stack of a plurality of said heat radiation fins closely laminated one on another.

14. A heat-pipe type cooling apparatus according to claim 12, wherein said member having high heat conductivity also serves as a reinforcement member attached to the ends of said heat pipes.

15. A heat-pipe type cooling apparatus according to claim 12, wherein said member having high heat conductivity serves as a part of a mounting frame attached to said cooling apparatus.

16. A heat-pipe type cooling apparatus according to claim 1, wherein said heat pipes are so bent that said heat radiation fins extend in vertical direction.

17. A heat-pipe type cooling apparatus according to claim 1, wherein said object to be cooled is an IGBT module.

18. A heat-pipe type cooling apparatus according to claim 1, wherein said object to be cooled is a GTO thyristor.

19. A heat-pipe type cooling apparatus according to claim 1, wherein said cooling apparatus is part of a vehicle control apparatus.

* * * * *